(12) United States Patent
Ellinger et al.

(10) Patent No.: US 9,620,501 B1
(45) Date of Patent: Apr. 11, 2017

(54) ENHANCEMENT-DEPLETION MODE CIRCUIT ELEMENT WITH DIFFERENTIAL PASSIVATION

(71) Applicant: Eastman Kodak Company, Rochester, NY (US)

(72) Inventors: Carolyn Rae Ellinger, Rochester, NY (US); Shelby Forrester Nelson, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/055,877

(22) Filed: Feb. 29, 2016

(51) Int. Cl.
| | | |
|---|---|---|
| *H01L 29/786* | (2006.01) | |
| *H01L 27/088* | (2006.01) | |
| *H01L 29/22* | (2006.01) | |
| *H01L 27/12* | (2006.01) | |

(52) U.S. Cl.
CPC ...... *H01L 27/0883* (2013.01); *H01L 27/1225* (2013.01); *H01L 27/1251* (2013.01); *H01L 29/22* (2013.01); *H01L 29/7869* (2013.01); *H01L 29/78606* (2013.01); *H01L 29/78696* (2013.01)

(58) Field of Classification Search
CPC ......... H01L 29/78642; H01L 29/78666; H01L 29/78669; H01L 29/78678
See application file for complete search history.

(56) References Cited

U.S. PATENT DOCUMENTS

| | | |
|---|---|---|
| 7,413,982 B2 | 8/2008 | Levy |
| 7,456,429 B2 | 11/2008 | Levy |
| 7,687,807 B2 * | 3/2010 | Koo ...................... H01L 27/281 257/348 |
| 7,789,961 B2 | 9/2010 | Nelson et al. |
| 8,653,516 B1 | 2/2014 | Nelson et al. |
| 8,791,023 B2 | 7/2014 | Ellinger et al. |
| 8,846,545 B2 | 9/2014 | Ellinger et al. |
| 8,927,434 B2 | 1/2015 | Ellinger et al. |

(Continued)

OTHER PUBLICATIONS

A. Dodabalapur, L. Torsi, H. E. Katz, *Science*, Apr. 14, 1995, vol. 268, pp. 270-271.

(Continued)

*Primary Examiner* — Cuong Q Nguyen
(74) *Attorney, Agent, or Firm* — William R. Zimmerli

(57) ABSTRACT

An enhancement-depletion circuit element includes a depletion-mode load transistor and an enhancement-mode drive transistor formed from the common elements of: a first patterned conductive layer including a load gate electrode and a drive gate electrode; a patterned inorganic dielectric stack including a load gate dielectric and a drive gate dielectric; a patterned inorganic semiconductor layer including a load semiconductor region and a drive semiconductor region; a second patterned conductive layer including a load source, a load drain, a drive source and a drive drain; and a patterned differential passivation structure having a patterned polymer dielectric layer and a patterned conformal inorganic dielectric layer. The depletion-mode load transistor has a load back-channel in contact with the patterned conformal inorganic dielectric layer. The enhancement-mode drive transistor has a drive back-channel in contact with the patterned polymer dielectric layer.

11 Claims, 14 Drawing Sheets

(56) References Cited

U.S. PATENT DOCUMENTS

| | | |
|---|---|---|
| 9,236,486 B2 | 1/2016 | Nelson et al. |
| 9,368,491 B2 * | 6/2016 | Ellinger ............. H01L 29/7869 |
| 9,443,887 B1 * | 9/2016 | Ellinger ............. H01L 29/7869 |
| 2009/0130858 A1 | 5/2009 | Levy |
| 2014/0061648 A1 | 3/2014 | Levy et al. |
| 2014/0061795 A1 | 3/2014 | Levy et al. |
| 2014/0061869 A1 | 3/2014 | Nelson et al. |
| 2014/0065838 A1 | 3/2014 | Ellinger et al. |

OTHER PUBLICATIONS

Sze in *Physics of Semiconductor Devices-$2^{nd}$ Ed.*, John Wiley & Sons (1981), pp. 438-443.

* cited by examiner

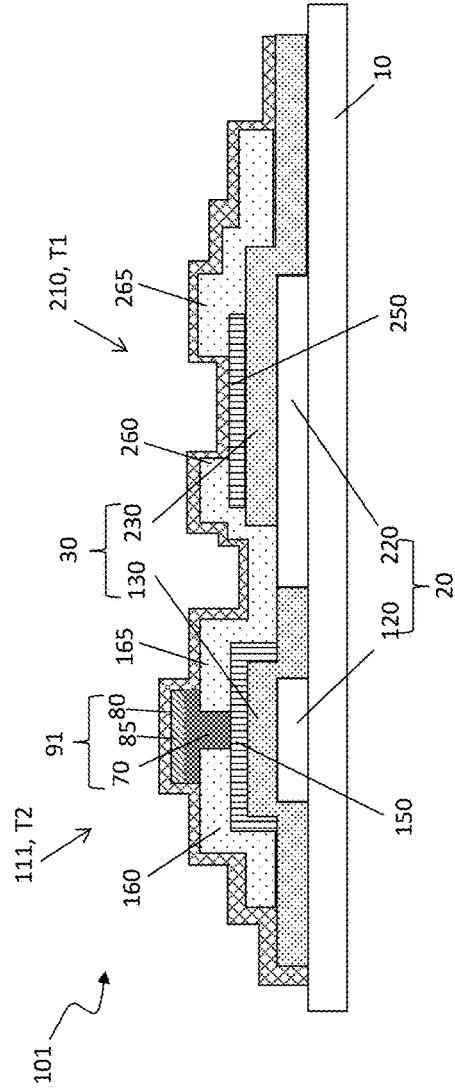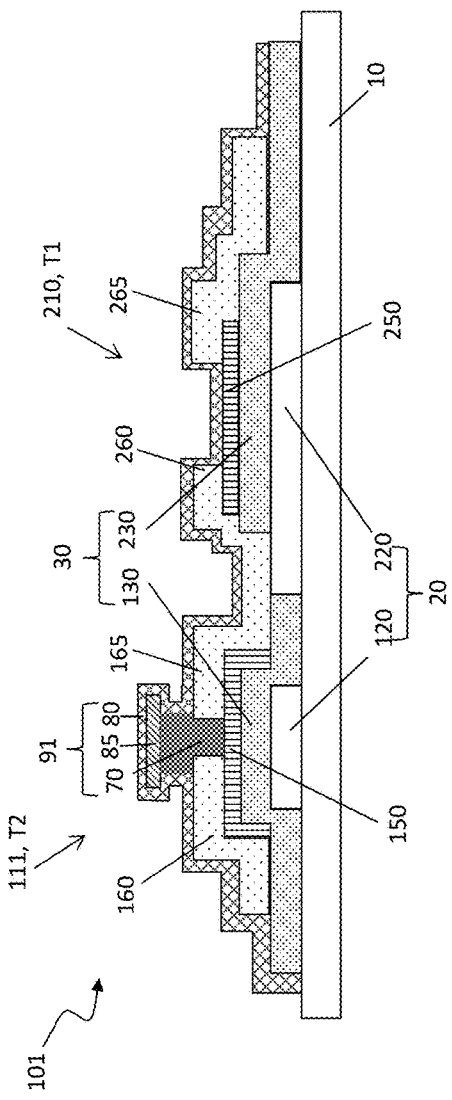
Figure 3a
Figure 3b

ENHANCEMENT-DEPLETION MODE CIRCUIT ELEMENT WITH DIFFERENTIAL PASSIVATION

CROSS-REFERENCE TO RELATED APPLICATIONS

Reference is made to commonly-assigned copending U.S. patent application Ser. No. 14/487,150, filed Sep. 16, 2014, entitled VERTICAL TFT WITH MULTILAYER PASSIVATION, by Ellinger et al; U.S. patent application Ser. No. 14/487,161, filed Sep. 16, 2014, entitled BOTTOM GATE TFT WITH MULTILAYER PASSIVATION, by Ellinger et al.; U.S. patent application Ser. No. 14/487,184, filed Sep. 16, 2014, entitled TOP GATE TFT WITH POLYMER INTERFACE CONTROL LAYER, by Ellinger et al.; U.S. patent application Ser. No. 14/487,216, filed Sep. 16, 2014, entitled METHOD OF FORMING A PATTERNED POLYMER LAYER, by Ellinger et al.; U.S. patent application Ser. No. 14/526,622, filed Oct. 29, 2014, entitled TFT SUBSTRATE WITH VARIABLE DIELECTRIC THICKNESS, by Ellinger et al.; U.S. patent application Ser. No. 14/526,634, filed Oct. 29, 2014, entitled ENHANCEMENT-DEPLETION MODE INVERTER WITH TWO TRANSISTOR ARCHITECTURES, by Ellinger et al.; U.S. patent application Ser. No. 14/526,652, filed Oct. 29, 2014, entitled METHOD FOR FORMING A VARIABLE THICKNESS DIELECTRIC STACK, by Effinger; U.S. patent application Ser. No. 14/526,675, filed Oct. 29, 2014, entitled ENHANCEMENT MODE INVERTER WITH VARIABLE THICKNESS DIELECTRIC STACK, by Ellinger et al.; U.S. patent application Ser. No. 14/737,544, filed Jun. 12, 2015, entitled VERTICAL AND PLANAR TFTS ON COMMON SUBSTRATE, by Ellinger et al.; the disclosures of which are incorporated herein in their entirety.

FIELD OF THE INVENTION

This invention relates generally to patterned thin film electronic devices. In particular, this invention relates to passivated metal-oxides devices including, for example, thin film transistors, inverters and circuits.

BACKGROUND OF THE INVENTION

The electronic and manufacturing issues associated thin film transistors (TFTs) can be viewed as representative of the electronic and manufacturing issues associated with many thin film components. TFTs are widely used as switching elements in electronics, for example, in active-matrix liquid-crystal displays, smart cards, and a variety of other electronic devices and components thereof. In typical applications of a thin film transistor, the desire is for a switch that can control the flow of current through the device. It is usually desired that when the switch is turned on a high current can flow through the device. The extent of current flow is related to the semiconductor charge carrier mobility. When the device is turned off, it is desired that the current flow be very small. The ratio between current flow in the on state and current flow in the off state is related to the native charge carrier concentration. It is further desired that the device remain unchanged during operation. The stability of transistors is typically evaluated by holding the device under a constant stress (or bias) that is consistent with the stress applied to the transistor in operation for a given application.

Many electronic devices benefit from the presence of either a passivation layer or a barrier layer or both. Thin film metal oxide TFTs, such as ZnO, GIZO, or GZO, have instabilities that can limit their adoption in practical applications. There has been a concerted effort recently to improve the stability of these types of TFTs with passivation layers. Typical passivation layer strategies employ inorganic thin films, such as $Al_2O_3$, as a passivation layer over all devices on a substrate. The use of these uniform inorganic passivation layers typically induces an uncontrolled negative threshold shift that can be undesirable. Complicated processing schemes have been introduced to passivate with inorganic materials without threshold shifts. Alternatively, researchers have used multilayer channels to modify the charge on the back-channel, for instance using two different stoichiometries of IGZO for the semiconductor layer. There has been limited work done to passivate inorganic TFTs with photopatternable polymers, with varied response. In most cases, a negative shift in threshold voltage is still present with passivation and the processing involves the complex multistep process associated with photolithography and additional post deposition annealing steps. There remains a need for a passivation process for metal oxide transistors which is simple, and which results in TFTs stable under bias stress with a desired threshold voltage.

Furthermore, it is recognized in the art that the material that is in contact with the back-channel of a semiconductor has an impact on the performance of the transistor. In the aforementioned cases, the passivation layer is deposited on the back-channel of a bottom gate device. In other architectures, controlling the back-channel interface is still important even when the material layer does not impact the environmental stability of the device. For instance, in the case of top gate TFTs it has been observed that ZnO-based transistors built on glass have very negative threshold voltages. There remains a need for device structures and material layers that control the back-channel interface in all types of device architectures including bottom gate transistors, top gate transistors, and vertical transistors.

A particularly useful electronic device in building functional circuitry is an inverter, which functions to invert the polarity of an input signal. In complementary metal-oxide semiconductor (CMOS) circuitry, inverters are typically easy to design but disadvantageously expensive to produce and utilize complicated production processes. It is possible to build all NMOS or all PMOS inverters. However, particularly for enhancement-depletion mode circuits there are challenges to independently controlling the behavior of each transistor in the inverter circuit. Typically, the depletion mode transistor will have a thicker semiconductor layer than the enhancement mode transistor, increasing process complexity and increasing cost.

There remains a need to build high quality inverters and other circuit elements using simple processes, by employing novel architectures to control transistor, and therefore, circuit performance. Furthermore, there still remains a need for these circuit elements to have high-quality passivation and back-channel control layers that result in stable, high-quality circuits and that can be formed with simple processing methods.

SUMMARY OF THE INVENTION

According to an aspect of the invention, an enhancement-depletion circuit element includes a depletion-mode load transistor and an enhancement-mode drive transistor. The depletion-mode load transistor and an enhancement-mode drive transistor are formed from the common elements of a first patterned conductive layer including a load gate electrode and a drive gate electrode, a patterned inorganic dielectric stack including a load gate dielectric and a drive gate dielectric, a patterned inorganic semiconductor layer including a load semiconductor region and a drive semiconductor region, a second patterned conductive layer including a load source, a load drain, a drive source and a drive drain, and a patterned differential passivation structure having a patterned polymer dielectric layer and a patterned conformal inorganic dielectric layer. The depletion-mode load transistor has a load back-channel in contact with the patterned conformal inorganic dielectric layer and the enhancement-mode drive transistor has a drive back-channel in contact with the patterned polymer dielectric layer.

BRIEF DESCRIPTION OF THE DRAWINGS

In the detailed description of the example embodiments of the invention presented below, reference is made to the accompanying drawings, in which:

FIGS. 3a and 3b are a cross-sectional view of example embodiments of an enhancement-depletion mode inverter including an example embodiment of a differential passivation structure, and including an additional inorganic dielectric layer;

FIG. 11 is a cross-sectional view of another example embodiment of an enhancement-depletion mode inverter having the equivalent circuit shown in FIG. 10a;

DETAILED DESCRIPTION OF THE INVENTION

Figure 1:
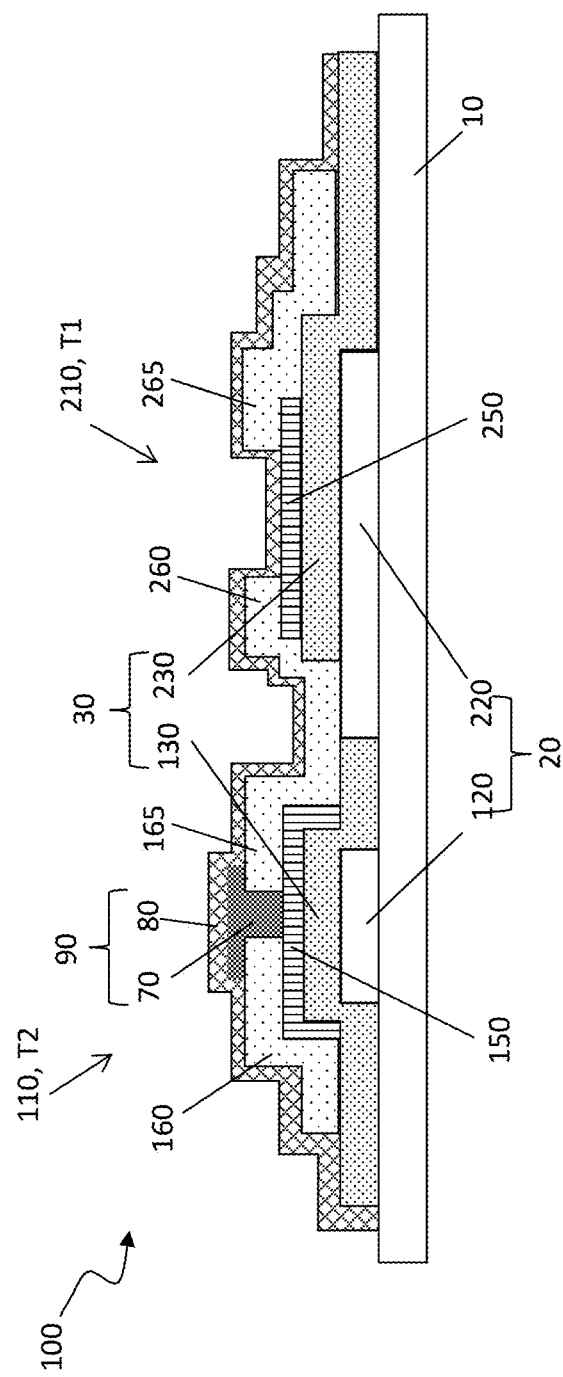
FIG. 1 is a cross-sectional view of an example embodiment of an enhancement-depletion mode inverter including an example embodiment of a differential passivation structure.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," "right" are used with reference to the orientation of the Figure(s) being described. Because components of embodiments of the present invention can be positioned in a number of different orientations, the directional terminology is used for purposes of illustration only and is in no way limiting.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the figures provided are not drawn to scale but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

The embodiments of the present invention all relate to thin film inorganic materials and devices that contain them. In preferred embodiments the thin film inorganic materials are deposited using an atomic layer deposition (ALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

Example embodiments of the present invention can be fabricated using selective area deposition (SAD) in combination with ALD. SAD employs a patterned material referred to as a "deposition inhibitor material," "deposition inhibiting material," or simply an "inhibitor" that inhibits the growth of a thin film material on the substrate when the substrate is subjected to an atomic layer deposition. The deposition only deposits in regions (selective areas) of the substrate where the inhibitor is not present. The phrase "deposition inhibitor material" and its equivalents refer herein to any material on the substrate that inhibits the deposition of material during ALD. The "deposition inhibitor material" includes the material applied to the substrate as well as the material resulting from any optionally subsequent crosslinking or other reaction that modifies the material that may occur prior to depositing an inorganic thin film on the substrate by atomic layer deposition. A polymeric deposition inhibitor material may be crosslinked after applying the polymer onto the substrate, before or during the patterning step.

The present invention is useful for making stable enhancement-mode and stable depletion-mode transistors on the same substrate. An enhancement-mode transistor is a transistor in which there is negligible off-current flow relative to on-current flow between a source and a drain at zero gate voltage. In other words, the transistor device is normally off. In contrast, a depletion-mode transistor is normally on, meaning that more than substantially negligible current flows between a source and a drain at zero gate voltage.

When the TFT operates in an enhancement-mode, the charges injected from the source electrode into the semiconductor are mobile and a current flows from source to drain, mainly in a thin channel region within about 100 Angstroms of the semiconductor-dielectric interface, see, for example, A. Dodabalapur, L. Torsi H. E. Katz, *Science*, Apr. 14, 1995, Vol. 268, pages 270-271, incorporated by reference herein. In the absence of a gate field the channel ideally has few charge carriers; as a result there is ideally no source-drain conduction when the device is in off mode.

The off-current in an enhancement-mode device is defined as the current flowing between the source electrode and the drain electrode when charge has not been intentionally injected into the channel by the application of a gate voltage. This occurs for a gate-source voltage more negative, assuming an n-channel device, than a certain voltage known as the threshold voltage, see, for example, Sze in *Physics of Semiconductor Devices*—2 Ed, John Wiley & Sons (1981), pages 438-443, incorporated by reference herein. The on-current is defined as the current flowing between the source electrode and the drain electrode when charge carriers have been accumulated intentionally in the channel by application of an appropriate voltage to the gate electrode and the channel is conducting. For an n-channel accumulation-mode TFT, this occurs at a gate-source voltage more positive than the threshold voltage. It is desirable for this threshold voltage to be slightly positive, for n-channel operation. Switching between on and off states is accomplished by the application and removal of an electric field from the gate electrode across the gate dielectric to the semiconductor-dielectric interface, effectively charging a capacitor.

Attractive TFT device characteristics of enhancement mode devices include a high ratio of the on-current to the off-current, and a steep sub-threshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (Sze in *Physics of Semiconductor Devices*—2 Ed, John Wiley & Sons (1981)):

$$I_d = \frac{W}{2L}\mu C_{ox}(V_g - V_{th})^2$$

where $I_d$ is the saturation source-drain current, $C_{ox}$ is the geometric gate capacitance associated with the insulating layer, W and L are physical device dimensions, $\mu$ is the carrier mobility in the zinc-oxide-based semiconductor, $V_g$ is the applied gate voltage, and $V_{th}$ is the threshold voltage. Ideally, the TFT allows passage of current only when a gate voltage of appropriate polarity is applied. However, with zero gate voltage, the off current between source and drain depends on the intrinsic conductivity $\sigma$ of the zinc-oxide-based semiconductor as well as the state of the semiconductor back-channel. It has been found that for metal oxide transistors the interface of the semiconductor opposite the gate, often called the back-channel, plays a role in the device performance. The one portion of the differential passivation structure of the present invention is useful to ensure that the metal oxide transistors operate in enhancement mode, while a second portion of the differential passivation structure of the present invention is useful to ensure that metal oxide transistors operate in depletion mode. Additionally, it is known that metal oxide transistors can be sensitive to environmental conditions. The differential passivation structures of the present invention also serve to protect the transistors from environmental conditions, thereby both passivating the device and providing barrier properties.

The TFT structures described herein include an inorganic semiconductor channel, preferably a metal-oxide-based semiconductor, with conducting electrodes, commonly referred to as a source and a drain, for injecting a current into the semiconductor and a capacitively coupled gate for controlling and/or modulating the source-drain current. Preferred metal oxide based semiconductors include ZnO based semiconductors. Examples of ZnO based semiconductors are ZnO, InZnO, InO, and InGaZnO and doped ZnO.

The production of inorganic thin film transistors and electronic devices from semiconductor, dielectric, conductive materials can be accomplished by conventional techniques known to the skilled artisan. The exact process sequence is determined by the structure of the desired transistor. Thus, in the production of a field effect transistor in a so-called inverted structure, a gate electrode can be first deposited on a substrate, for example a vacuum- or solution-deposited metal or organic conductor, or an ALD-deposited conductor. The gate electrode is insulated with a dielectric and the source and drain electrodes and a layer of the inorganic semiconductor material are applied on top. The structure of such a transistor, and hence the sequence of its production, are varied in the customary manner known to a person skilled in the art. Alternatively, a gate electrode is deposited first, followed by a gate dielectric, the semiconductor is applied, and finally the contacts for the source electrode and drain electrode are deposited on the semiconductor layer. In most embodiments, a field effect transistor includes an insulating layer, a gate electrode, a semiconductor layer including an inorganic material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer.

For conductive layers, such as those used for the gate, source, and drain electrodes, useful materials include metals and conductive metal oxides. Examples of useful conductors include Al, Cr, Mo, Ag, aluminum doped ZnO (AZO), and indium doped tin oxide (ITO). The gate dielectric can be an inorganic gate dielectric, for example an insulating metal oxide such as aluminum oxide, HfO, ZrO, or SiO2. The inorganic semiconductor layer can be a metal oxide semiconductor, for example a ZnO based semiconductor. These layers of the TFT can be deposited using any method known in the art, including CVD, PECVD, sputtering or evaporation. Atomic Layer Deposition (ALD) is a useful method of deposition, and more specifically spatial ALD due to the low required processing temperature. The active layers can be patterned using methods including, selective deposition, sequential masking, photolithography, laser, and/or other means known to the skilled artisan.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by exposing the substrate to alternate cycles of two or more reactive materials, commonly referred to as precursors. Traditional ALD systems are chamber based, and operate under vacuum. In a typical process, a first precursor is applied to react with the substrate, followed by the removal of the excess of the first precursor from the vacuum chamber. Next, a second precursor is applied to react with the first precursor on the substrate, followed by the removal of the excess of the second precursor from the vacuum chamber. This process is repeated to build up the coating thickness with each reaction happening only at the substrate surface.

ALD can be performed at or near atmospheric pressure and over a broad range of temperatures, preferably at a temperature of under 300° C. A spatial ALD process can be used. This process, commonly referred to as S-ALD or simply SALD, is described in at least one of commonly assigned U.S. Pat. Nos. 7,413,982; 7,456,429; 7,789,961; and U.S. Patent Application Publication No. 2009/0130858. All of the above-identified patents and patent applications are incorporated by reference herein in their entirety.

SALD produces coatings with thicknesses that can be considered consistent, uniform, or even exact. SALD produces coatings that can be considered conformal or even highly conformal material layers. SALD is also compatible with a low temperature coating environment. Additionally, SALD is compatible with web coating, making it attractive for large-scale production operations. Even though some web coating operations may experience alignment issues, for example, web tracking or stretching issues, the vertical transistor architectures of some embodiments of the present invention can reduce reliance on high resolution or very fine alignment features during the manufacturing process. Therefore, SALD is well suited for manufacturing the present invention.

Returning now to the discussion of the transistor, in embodiments of the present invention, the back-channel of the inorganic semiconductor (the side opposite the gate) of the transistors of an inverter are in contact with different portions of a differential passivation structure. Inverters of the present invention operate in enhancement-depletion mode, and have an enhancement mode drive TFT and a depletion mode load TFT. The back-channel of the drive TFT, referred to herein as the drive back-channel, is in contact with a polymer dielectric layer, while the back-channel of load TFT, referred to herein as the load back-channel, is in contact with an inorganic dielectric layer. In preferred embodiments, the inorganic dielectric layer that is in contact with the load back-channel is also present over the polymer dielectric layer that is contact with the drive back-channel. As such, the differential passivation structure of the present invention contains both polymer dielectric layers and inorganic dielectric layers that are patterned to selectively and independently control the back-channel of the drive and load TFTs, and therefore their threshold voltage.

Embodiments of the present invention relate to electrically insulating polymer layers useful in controlling the back-channel of inorganic semiconductor thin film transistors and to differential passivation structures containing polymer insulating layers and thin film inorganic insulating layers. As discussed above, the inorganic thin film transistors can be formed by any process known in the art. Preferred methods of fabricating the transistors include using SAD in combination with spatial ALD.

The phrase "polymer dielectric" as used herein refers to a polymeric material used as an electrically insulating layer and that is present in the final application, and is useful to distinguish the polymer dielectric material from other polymeric materials or polymer layers that may be used in the process. The polymer insulating layer of the differential passivation structure is composed of a polymer dielectric. Similarly, the differential passivation structures can contain one or more layers of polymer insulating layers. The polymer dielectric of the present invention is preferably a polymer that can be solution deposited, and is mechanically stable in the final application. Illustrative of polymer dielectrics are polyimides, phenoxy resins, acrylic resin, epoxy resins, polyacrylates, polyvinyl phenol, polyvinyl pyrrolidone, organosiloxanes (such as PDMS) and the like or their combinations and blends. The preferred polymer dielectrics are epoxy resins and polyimides. The polymer can be curable, with either thermal or radiation curable composition. The polymer does not need to be radiation curable or photosensitive, but photosensitive formulations are useful in the present invention so long as the final cured polymer layer has the structural and mechanical properties required in the final application. Polyimide is a preferred structural polymer dielectric due to the combination of film properties such as low stress, low CTE, low moisture uptake, high modulus and good ductility for microelectronic applications. Epoxy resins are also preferred due to their thermal and chemical properties. Radiation curable compositions comprising a highly branched, multifunctional epoxy bisphenol A-novolac resins, such as Epon SU-8 from Momentive Specialty Chemicals Inc. is one example of a useful epoxy resin.

Functionalized poly(siloxanes) include epoxy-functionalized, carboxyl-functionalized, polyether-functionalized, phenol-functionalized, amino-functionalized, alkoxy-functionalized, methacryl-functionalized, carbinol-functionalized, hydroxy-functionalized, vinyl-functionalized, acrylic-functionalized, silane-functionalized, trifluoro-functionalized, or mercapto-functionalized poly(organosiloxanes). Block copolymers can also be employed if containing substantial siloxane repeat units. Such polymers can be prepared as described in numerous patents and publications or are commercially available from, for example, General Electric Company, Schenectady, N.Y.; Dow Corning, Midland, Mich.; or Petrarch Systems, Bristol, Pa.

The polymer insulating layers of the differential passivation structure are patterned. Patterning can be accomplished using any method known in the art. In some instances, patterning can be using a patterned inorganic thin film dielectric layer of the differential passivation structure insulating layer as a hard mask to etch a blanket-deposited polymer dielectric. Alternatively a "positive-acting" polymer (the polymer is removed where it has been exposed) can be used as the polymer dielectric, and the patterned inorganic thin film insulating layer can be used as a photo-mask for exposing the dielectric layer. In both cases, the resultant polymer insulating layer has a pattern that is defined by the pattern of the inorganic thin film layer. A conformal inorganic thin film layer can be deposited over the patterned polymer insulating layer sealing the edges. It is preferred that the conformal inorganic thin film layer is patterned such that the thin film layer seals the edges of the polymer layer, but has openings allowing contact to, for instance, the electrodes of the TFT. In preferred embodiments, the conformal inorganic thin film layer that seals the edges of the polymer dielectric layer is the also in contact with the back-channel of the load TFT.

Preferably, inorganic thin film dielectric layers are deposited using ALD, more preferably using spatial ALD. The inorganic thin film layer can be deposited uniformly and patterned using any method known in the art, including using a photolithographic process. Preferably, the inorganic thin film layer can be patterned as deposited by using the combination of selective area deposition (SAD) and ALD.

As discussed above, SAD employs a patterned material referred to as a "deposition inhibitor material" which inhibits the growth of a thin film material on the substrate when the substrate is subjected to an atomic layer deposition. The deposition inhibitor material can be a compound or polymer that, after being applied, is subsequently polymerized, cross-linked, or polymerized and cross-linked.

Cross-linking can be used to insolubilize a polymeric deposition inhibitor material after application onto the surface of the substrate. The crosslinking can occur prior to patterning or may occur during patterning in order to contribute to the patterning step, for example, by employing crosslinking initiated by, and patterned by, actinic radiation, followed by removal of non-crosslinked polymer, for example, by solvent.

The polymeric inhibitor may be soluble in any convenient solvent and may have any useful molecular weight, preferably in the range of 2,000 to 2,000,000. It may include a single functional group, or may include a plurality of functional groups. In the case of a plurality, the polymer may be a random, periodic, or block polymer. For polymers with chiral centers the polymer may be isotactic, syndiotactic, or atactic. The polymer may have side chains and may be a graft copolymer. The polymer may be linear or branched. The polymer may have low numbers of free acid groups. Preferred polymers that are soluble in non-polar solvents are poly(methylmethcrylate) or epoxy resins. Polymers soluble in polar solvents such as water, alcohols, or ketones are particularly useful. Polymers may include amide groups, such as poly(amide), poly(vinylpyrollidone), and poly(2-ethyl-oxazoline). A particularly useful deposition inhibitor is poly(vinylpyrollidone).

The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned to form a patterned layer of the deposition inhibitor material. The active inhibiting material may be suspended or dissolved in a solvent or vehicle.

In some applications it is desirable to have a polymer dielectric having the same pattern as the polymer inhibitor used to pattern an ALD deposited inorganic thin film layer. In these applications, the polymer inhibitor is selected to advantageously have inhibitor properties and dielectric properties, as well as mechanical properties such that the polymer is stable in the final structure and application. When the polymer inhibitor is coated with another polymer dielectric layer it may not be necessary to modify the polymer inhibitor surface. In some embodiments, however, the polymer inhibitor is a switchable polymer inhibitor. A switchable polymer inhibitor is a polymer that as deposited, or as patterned, inhibits ALD growth of inorganic thin films. Upon subjecting the switchable polymer inhibitor to a suitable treatment, the polymer loses its inhibition properties and the ALD is now able to nucleate on the polymer surface. Suitable treatments include high energy oxygen processes, such as oxygen plasmas and UV-ozone treatments. Preferred switchable polymer inhibitors include epoxy resins (such as SU-8), organosiloxanes (such as PDMS), and polyvinyl pyrrolidone.

The substrates used in the present invention can be any material that acts as a mechanical support for the subsequently coated layers. The substrate can include a rigid material such as glass, silicon, or metals. Useful substrate materials include organic or inorganic materials. Flexible supports or substrates can be used in the present invention. Nominally rigid materials that are flexible due to their thinness may also be used. These include glass at thicknesses below 200 µm and metals at thicknesses below 500 µm.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns may include patterns that modulate light transmission or electrical conductivity within or on the substrate. The patterns may include complete devices, circuits, or active elements existing on the substrate. The patterns may include portions of devices, circuits, or active elements awaiting subsequent processing steps for completion.

Figure 2:
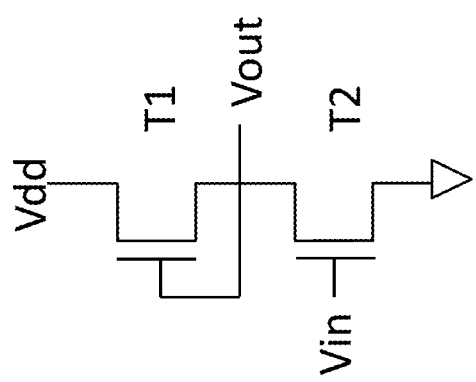
FIG. 2 is an equivalent circuit of the enhancement-depletion mode inverter shown in FIG. 1.

Turning now to the figures, FIG. 1 illustrates an enhancement-depletion mode inverter including the differential passivation structure of the present invention. The enhancement-depletion mode inverter of FIG. 1 is shown in a cross-sectional view and has the equivalent circuit shown in FIG. 2. The inverter includes the first and second transistors T1 and T2, which each include an oxide semiconductor. The first transistor T1 functions as a load transistor, and the second transistor T2 functions as a switching or drive transistor. The first transistor T1 is operated in a depletion mode and has an inorganic dielectric in contact with the back-channel of the transistor. The second transistor T2 is operated in enhancement mode and has an organic dielectric in contact with the back-channel of the transistor. The depletion mode operation of the first transistor T1 implies that the threshold voltage is shifted in a negative direction with respect to the threshold of the drive transistor T2. Each of the first and second transistors T1 and T2 includes a gate, a gate dielectric layer, a semiconductor layer, and source and drain electrodes. The semiconductor layer may be made of a semiconducting metal oxide material, and is preferably a ZnO-based semiconductor, for example, but not limited to, ZnO or InGaZnO4. As shown in FIG. 1, an enhancement-depletion-mode inverter 100 of the present invention is formed on substrate 10. Enhancement-depletion-mode inverter 100 has a load transistor 210 having a bottom gate architecture with a load source 260, a load drain 265, a load channel region, a load gate dielectric 230 in the load channel region having a load dielectric thickness, a load semiconductor 250, and a load gate electrode 220. The drive transistor 110 of the enhancement-depletion-mode inverter 100 of the present invention has a bottom gate architecture with a drive source 160, a drive drain 165, drive channel region, a drive gate dielectric 130 in the drive channel region having a drive dielectric thickness, a drive semiconductor 150 and a drive gate electrode 120. The drive and load transistors 110, 210 are connected as in the equivalent circuit shown in FIG. 2; the load source 260 is electrically connected to the drive drain 165 and the load source 260 is electrically connected to the load gate electrode 220.

The drive and load transistors 110, 210 are preferably formed from shared material layers. As shown in FIG. 1, the drive gate electrode 120 and load gate electrode 220 are separate regions of a first patterned conductive layer 20. The drive gate dielectric 130 and load dielectric are separate regions of a patterned inorganic dielectric stack 30. Patterned inorganic dielectric stack 30 can have a single layer as shown in FIG. 1, or can be formed of multiple layers. The dielectric stack can be formed from layers having different patterns, so that the load gate dielectric and the drive gate dielectric have different thickness as described in commonly-assigned copending U.S. application Ser. No. 14/526,622 and U.S. application Ser. No. 14/526,675 that are incorporated by reference herein in their entirety.

The drive and load transistors 110, 210 as shown in FIG. 1 have the same architecture and are formed from the same material layers. Without the differential passivation structure 90, both transistors 120 and 210 would have similar performance and in most cases would behave as enhancement-mode transistors, although under certain conditions it is possible that they could behave as depletion mode transistors. In order to build a functional enhancement-depletion-mode inverter the differential passivation structure 90 of the present invention is used to independently control the back-channel of the load transistor and drive transistor. As shown in FIG. 1, differential passivation structure 90 has a patterned polymer dielectric layer 70 that is in contact with drive back-channel, which is the drive semiconductor 150 in the back-channel region. The drive transistor, as discussed, operates in an enhancement-mode due to the drive back-channel being in contact with the patterned polymer dielectric layer 70 of differential passivation structure 90. Differential passivation structure 90 has a patterned conformal inorganic dielectric layer 80 that is in contact with the load back-channel, which is the load semiconductor 250 in the back-channel region of the load transistor. The load transistor operates in a depletion-mode due to the load back-channel being in contact with the patterned conformal inorganic dielectric layer 80 of differential passivation structure 90. The patterned conformal inorganic dielectric layer 80 also serves to seal the edges of the patterned polymer dielectric layer 70 to further add environmental stability to inverter 100. The patterned conformal inorganic dielectric layer 80 can be formed of a single layer of conformal inorganic dielectric material as shown in FIG. 1, or can be formed from a stack of multiple layers of conformal inorganic dielectric.

The use of a differential passivation structure 90 as shown in FIG. 1 has the advantage of providing the ability to independently tune the threshold voltage of two transistors that would otherwise have the same threshold voltage. Additionally, using two transistors with common layers of the same materials for the enhancement-mode and depletion-mode TFTs provides for a simple manufacturing method for such circuits. As shown in FIG. 1, and in all embodiments of the present invention, the drive and load of an enhancement-depletion-mode inverter can be formed simultaneously and have their individual elements formed in common layers.

FIGS. 3a and 3b include differential passivation structure 91. Differential passivation structure 91 is functionally the same as differential passivation structure 90, however it has an additional patterned inorganic dielectric layer 85 between the patterned polymer dielectric layer 70 and the patterned conformal inorganic dielectric layer 80. All other features of the inverters illustrated are the same as shown in FIG. 1, and should be understood from the previous description. As shown in FIGS. 3a and 3b the additional patterned inorganic dielectric layer 85 is only present in the region of the differential passivation structure 90 near the back-channel of the drive transistor 110. The embodiments shown in FIGS. 3a and 3b are illustrative of the structure that would be obtained if the additional patterned inorganic dielectric layer 85 is used to pattern the patterned polymer dielectric layer 70. As shown in FIG. 3a, the edges of the additional patterned inorganic dielectric layer 85 and the patterned polymer dielectric layer 70 can be aligned. In alternative embodiments, the structures shown in FIG. 3b can be used, where there is a reentrant profile formed between the patterned polymer dielectric layer 70 and the additional patterned inorganic thin film dielectric layer 85. The second or additional patterned inorganic dielectric layer 85 can be a different material than that of the first patterned conformal inorganic thin film dielectric layer 80. The additional patterned inorganic dielectric layer 85 is preferably the same material as the patterned conformal inorganic dielectric layer 80, which may make it difficult to detect the boundary between layers 80 and 85 in these embodiments. The structure will instead be recognized due to the greater thickness of inorganic dielectric material located over the patterned polymer dielectric layer 70, compared to the thickness of inorganic dielectric material not located over the patterned polymer dielectric layer 70.

Figure 4:
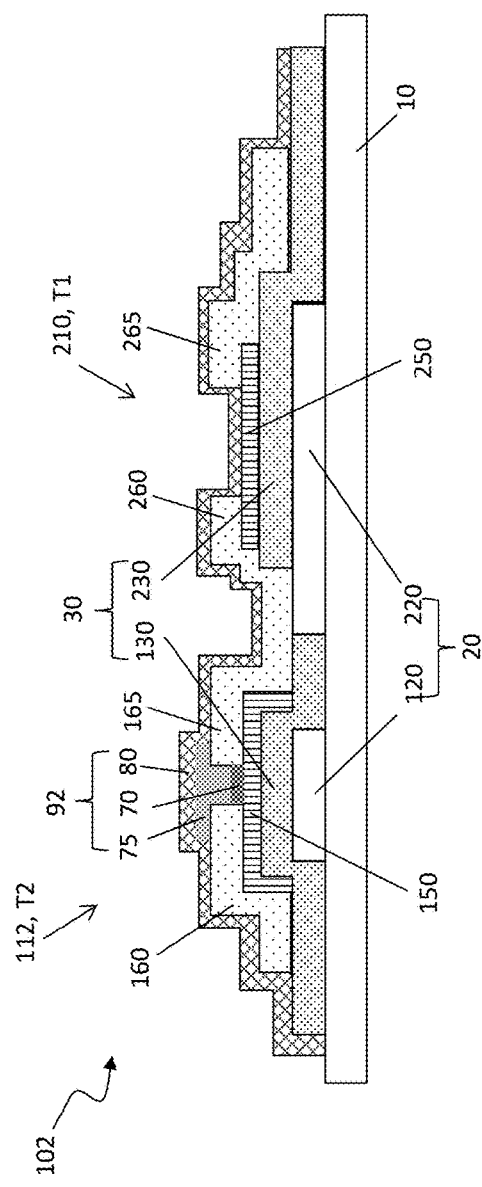
FIG. 4 is a cross-sectional view of another example embodiment of an enhancement-depletion mode inverter including an example embodiment of a differential passivation structure.

FIG. 4 is a cross-sectional diagram of a bottom gate TFT 112 of an inverter of the present invention having an alternative differential passivation structure 92. The elements in inverter 102 are the same as those in FIG. 1, however the differential passivation structure 92, has two polymer dielectric layers 70 and 75. All other features of the inverters illustrated are the same as shown in FIG. 1, and should be understood from the previous description. As in FIG. 1, the patterned polymer dielectric layer 70 is in contact with the drive back-channel. In the embodiment shown in FIG. 4, the patterned polymer dielectric layer 70 is preferably a polymer that is both a deposition inhibitor and an insulating material. The patterned polymer dielectric layer 70 preferably has the same pattern as the gap between the source and drain electrodes 160, 165. In some embodiments the patterned polymer dielectric layer 70 can be used to pattern the source and drain electrodes 160, 165 using an ALD and SAD process. In these embodiments, the patterned polymer dielectric layer 70 is both polymer dielectric and a deposition inhibitor material. The patterned polymer dielectric layer 70 is in contact with the drive back-channel, and in contact with the second or additional patterned polymer dielectric layer 75. The additional patterned polymer dielectric layer 75 is in contact conformal inorganic dielectric layer, and serves to increase the thickness of the polymer dielectric of the differential passivation structure 92, and in fabrication enables the growth of the conformal inorganic dielectric materials whose growth would otherwise be inhibited a polymeric inhibitor. In one preferred embodiment, the second polymer layer 75 is polyvinylpyrrolidone.

Figure 5:
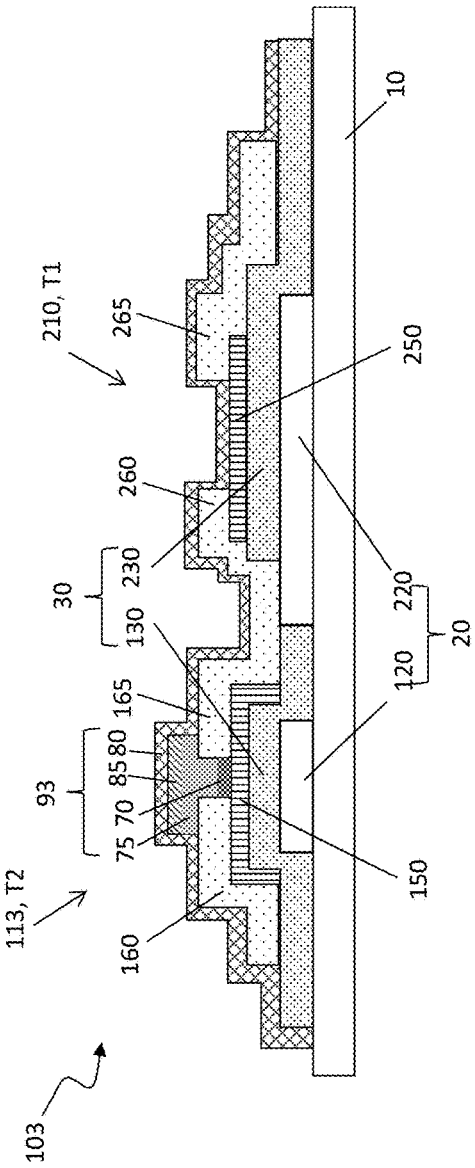
FIG. 5 is a cross-sectional view of another example embodiment of an enhancement-depletion mode inverter including an example embodiment of a differential passivation structure, and including an additional inorganic dielectric layer.

FIG. 5 includes a cross-sectional diagrams of a bottom gate TFT 113 of an inverter 103 of the present invention having an alternative differential passivation structure 93. The elements in inverter 103 are the same as those in FIG. 4, however the differential passivation structure 93 has an additional patterned inorganic dielectric layer 85. Additional patterned inorganic dielectric layer is the same as illustrated in FIGS. 3a and 3b, and should be understood from the previous descriptions.

Figure 6:
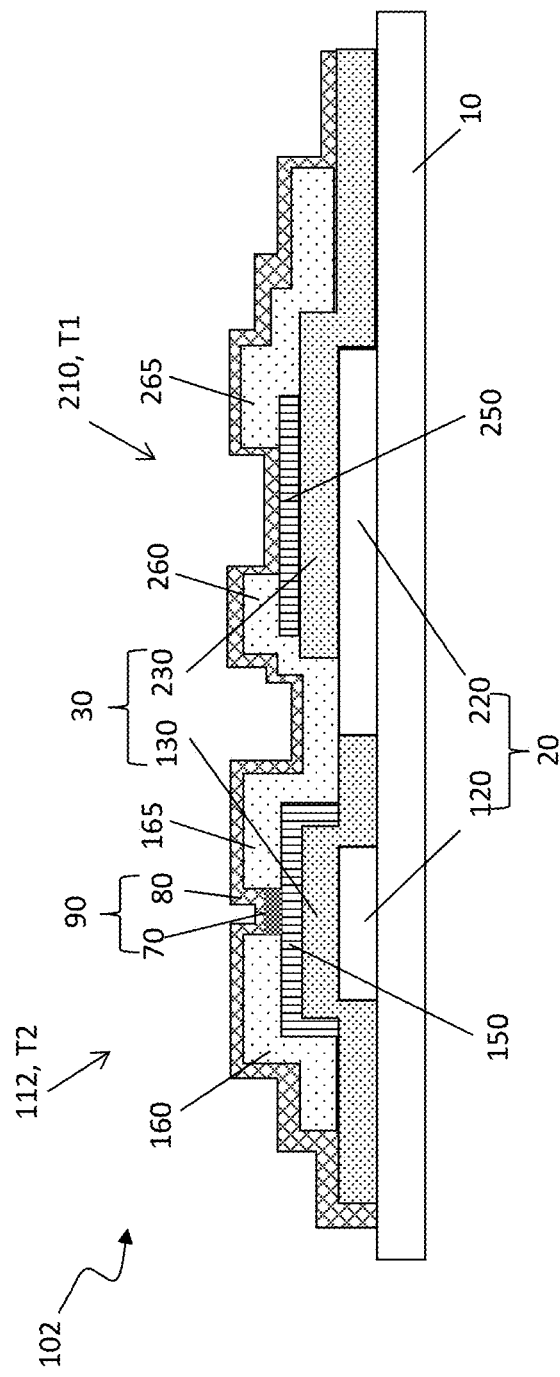
FIG. 6 is a cross-sectional view of another example embodiment of an enhancement-depletion mode inverter including an example embodiment of a differential passivation structure.

FIG. 6 is a cross-sectional diagram of another embodiment of a bottom gate TFT 112 of inverter 102 of the present invention. As shown in FIG. 6, the differential passivation structure 90 includes a patterned polymer dielectric layer 70 that is in contact with the drive back-channel portion of semiconductor layer 150. The patterned polymer dielectric layer 70 preferably has the same pattern as the gap between source and drain electrodes 160, 165, and in the embodiment shown in FIG. 6 the polymer layer 70 was used to pattern the source and drain electrodes 160, 165 using an ALD and SAD process. In these embodiments, the patterned polymer dielectric layer 70 is formed from a switchable polymer inhibitor which is both an insulating polymer and a deposition inhibitor material. As described above, a switchable polymer inhibitor can lose its inhibiting property after exposure, for example, to an oxygen plasma or UV-ozone process. In one preferred embodiment, the patterned polymer dielectric layer 70 is polyvinylpyrrolidone; in other embodiments a preferred polymer for the patterned polymer dielectric layer 70 is a novalac resin. Differential passivation structure 90 also contains patterned conformal inorganic thin film dielectric layer 80 that is over the patterned polymer dielectric layer 70 and over and in contact with the back-channel of load transistor 210. Patterned conformal inorganic dielectric layer 80 is the same as illustrated in FIGS. 1 through 5 and should be understood from the previous description. Using a switchable inhibitor polymer to pattern the source and drain electrodes 160, 165 using an ALD and SAD process allows for a simpler fabrication of the differentially passivated inverter 101. There is no need to remove the inhibitor or add an additional polymer layer.

FIGS. 1 through 6 and their descriptions are provided to set forth features of the present invention and serve to illustrate the key aspects of the differential passivation structure. For ease of understanding, the previous descriptions focused on typical planar bottom gate transistors where it is necessary to both control the back-channel interface and protect the device from environmental conditions by passivating the device. However, the differential passivation strategy employed in FIGS. 1 through 6 can be employed in any TFT structure and used to control the performance of individual transistors by differentiating which material is in contact with the back-channel of any give TFT. Furthermore, while the inorganic dielectric layer in contact with the back-channel of the load transistor has been described as a conformal inorganic dielectric layer, it should be understood that inorganic dielectric layers which are not conformal will have equal effect on transistor performance. The present invention advantageously utilizes a conformal dielectric layer in order to seal the edges of the polymer layer.

Inverters built from either top gate or bottom gate TFT architectures benefit from back-channel control. Similarly, planar or vertical transistor architectures can be used to fabricate enhancement-depletion-mode inverters utilizing the differential passivation structure of the present invention. Additionally, where appropriate, inverters utilizing TFTs of mixed vertical and planar architectures can also benefit from the differential passivation structure of the present invention. FIGS. 7 through 13 illustrate some of the additional embodiments of enhancement-depletion-mode inverters utilizing differential passivation structures of the present invention. It should be understood that the invention is not limited to the embodiments shown and that variations and modifications can be effected within the scope of the invention.

Some embodiments of the present invention relate to short channel vertical thin film transistors (VTFTs) which contain a gate structure that defines a vertical portion of the channel. The term vertical transistor as used herein refers to transistors where the source and drain which define a single channel are at two different distances from the substrate surface (as measured orthogonal to the substrate). This arrangement results in vertical transistors where at least a portion of the channel is vertically oriented with respect to the substrate, which is to say, not parallel to the top surface of the substrate. Vertical transistors of the present invention include those that have portions of their channels in an arrangement that is parallel to the substrate surface, as long as they have a portion which is not parallel. The vertical transistors of the present invention are similar to bottom gate transistors, in that they have an exposed back-channel as fabricated and it is therefore desirable to both control the back-channel interface and protect the device from environmental conditions by passivating the device.

Some embodiments of the vertical transistors of the present invention are formed using a gate structure. As used herein, the gate structure can be any structure which has a reentrant profile. The gate structure can be uniform in material composition, or be formed of multiple materials. The gate structure can also be referred to as a post, as long as the post has the required reentrant profile. The gate structure can be formed using a post and cap, where the cap extends beyond the wall of the post to define the reentrant profile. The gate structure can be formed from any material, including both conductive and insulating materials. The electrically conductive gate structure, as used herein, refers to the structure which contains the conductive material which will be used to gate the vertical transistor channel. The electrically conductive gate structure is at least conductive on the surface within the reentrant profile. In some embodiments, the electrically conductive gate structure includes a gate structure with an electrically conductive gate layer. In other embodiments, the gate structure comprises only conductive materials, such that the gate structure and the electrically conductive gate structure can be one and the same.

Figure 7:
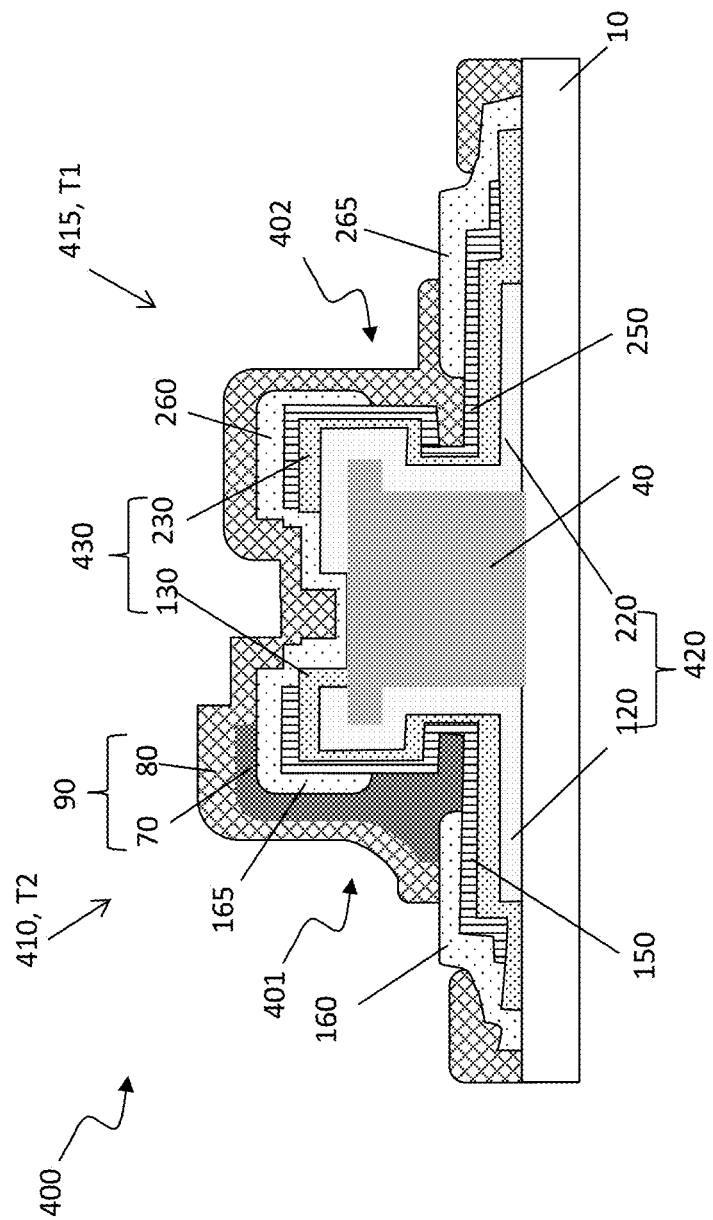
FIG. 7 is a cross-sectional view of an example embodiment of an inverter including a single vertical-support-element, and including another example embodiment of a differential passivation structure.

Turning now to the figures, FIG. 7 illustrates an enhancement-depletion mode inverter formed over a single VTFT gate structure using the differential passivation structure of the present invention. The enhancement-depletion mode inverter of FIG. 7 is shown in cross-sectional view, has an equivalent circuit shown in FIG. 2, and is functionally equivalent to the inverter shown in FIG. 1. Independently operable VTFTs formed over a common VTFT gate structure are employed in FIG. 7, and are described in commonly assigned U.S. Pat. No. 9,236,486 that is incorporated by reference herein in its entirety. The elements of inverter 400 of FIG. 7 with the exception of the vertical gate structure 40 are the same as those shown in FIG. 1, and should be understood from the previous description.

As shown in FIG. 7, vertical gate structure 40 is an insulating gate structure having two reentrant profiles 401 and 402 on substrate 10. The drive and load TFTs are formed on either side of the vertical gate structure 40, one in each of the reentrant profiles—as shown. As in FIG. 1, the enhancement-depletion-mode inverter 400 of the present invention has a VTFT load transistor 415, T1 having a VTFT architecture with a load source 260, a load drain 265, a load channel region, a load gate dielectric 230 in the load channel region having a load dielectric thickness, a load semiconductor 250, and a load gate electrode 220. The drive transistor VTFT 410, T2 of the enhancement-depletion-mode inverter 400 of the present invention has a VTFT architecture with a drive source 160, a drive drain 165, drive channel region, a drive gate dielectric 130 in the drive channel region having a drive dielectric thickness, a drive semiconductor 150 and a drive gate electrode 120. The drive and load transistors T2, T1 are connected as in the equivalent circuit shown in FIG. 2; the load source 260 is electrically connected to the drive drain 165 and the load source 260 is electrically connected to the load gate 220. The reentrant profiles 401 and 402 of transistors 410 and 415 respectively, allows a dimension of the semiconductor material channel of the transistor to be associated with the thickness (or height) of the VTFT gate structure 40. Advantageously, this architecture of the present invention reduces reliance on high resolution or very fine alignment features during the manufacture of transistors that include short channels. Furthermore, the separation of the source and drain electrodes 160, 165 and 260, 265 of transistors 410, 415 are primarily determined by the reentrant profiles 401, 402 in the VTFT gate structure 40.

The drive and load VTFTs 410, 415 on substrate 10 are preferably formed from shared material layers. As shown in FIG. 7, the drive TFT gate electrode 120 and load TFT gate electrode 220 are separate regions of a first patterned conductive layer 20. As shown in FIG. 7, the first patterned conductive layer 420 is a conformal conductive layer that is patterned to provide the load gate and the drive gate in the reentrant profiles of the VTFT gate structure 40. Similarly, the patterned dielectric stack 430 is a conformal dielectric stack, which maintains the reentrant profiles, and the drive gate dielectric 130 and load dielectric are separate regions of a patterned dielectric stack 430. Dielectric stack 430 can have a single layer as shown in FIG. 7, or can be formed of multiple layers. The dielectric stack can be formed from layers having different patterns, so that the load gate dielectric and the drive gate dielectric have different thickness as described in commonly-assigned copending U.S. application Ser. No. 14/526,622 and U.S. application Ser. No. 14/526,675 that are incorporated by reference herein in their entirety.

The drive and load VTFTs 410, 415 as shown in FIG. 7 have the same architecture and are formed from the same material layers. Without the differential passivation structure 90, both transistors 410 and 415 would have similar performance and in most cases would behave as enhancement mode transistors, although it is possible that they could behave as depletion mode transistors. In order to build a functional enhancement-depletion mode inverter the differential passivation structure 90 of the present invention is used to independently control the back-channel of the load and drive transistor. The differential passivation structure 90 shown in FIG. 7 is the same as that in FIG. 1. Differential passivation structure 90 has a patterned polymer dielectric layer 70 that is in contact with the drive semiconductor 150 in the back-channel region, referred to as the drive back-channel, in the first reentrant profile 401. Differential passivation structure 90 has a patterned conformal inorganic dielectric layer 80 that is in contact with the load semiconductor 250 in the back-channel region, referred to as the load back-channel, in the second reentrant profile 402. The patterned conformal inorganic dielectric layer 80 also serves to seal the edges of the patterned polymer dielectric layer 70 to further add environmental stability to inverter 400. The patterned conformal inorganic dielectric layer 80 can be formed of a single layer of conformal inorganic dielectric material as shown in FIG. 7, or can be formed from a stack of multiple layers of conformal inorganic dielectric.

The use of a differential passivation structure 90 as shown in FIG. 7 has the advantage of providing the ability to independently tune the threshold voltage of two transistors that would otherwise have the same threshold voltage. Additionally, by using two transistors with common layers of the same materials for the enhancement-mode and depletion-mode TFTs provides for a simple manufacturing method for such circuits. The addition of the VTFT gate structure as shown in FIG. 7 allows for the easy fabrication of short channel, high performance TFTs.

Figure 8:
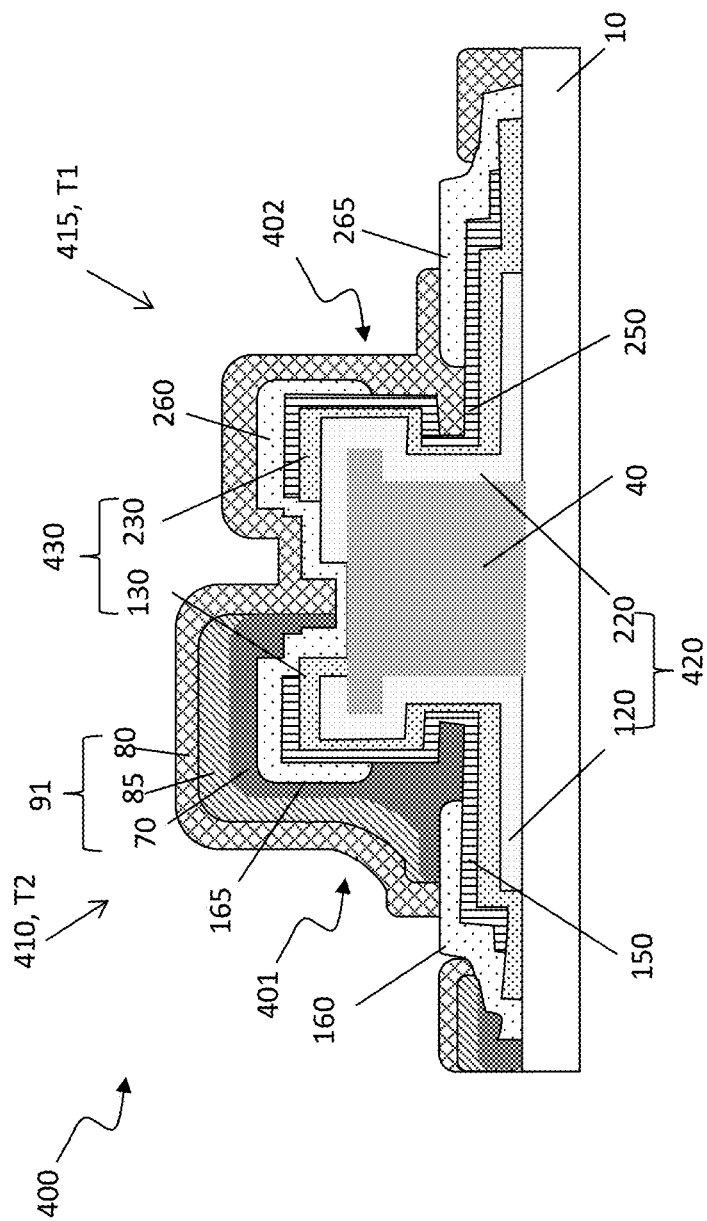
FIG. 8 is a cross-sectional view of another example embodiment of an inverter including a single vertical-support-element, and including another example embodiment of a differential passivation structure.

FIG. 8 illustrates the differential passivation structure 91 with an additional patterned inorganic dielectric layer 85 between the patterned polymer dielectric layer 70 and the patterned conformal inorganic dielectric layer 80 as employed in an inverter formed over a common VTFT gate structure. All other features of the inverters illustrated are the same as shown in FIG. 7, and should be understood from the previous description. The differential passivation structure 91 shown in FIG. 8 is the same as that shown FIG. 3a, and should be understood from the previous description. Alternative embodiments where a reentrant profile is formed by the patterned polymer dielectric layer 70 and the patterned conformal inorganic dielectric layer 80, as illustrated in FIG. 3b, are included in the present invention as employed in a VTFT structure.

Figure 9:
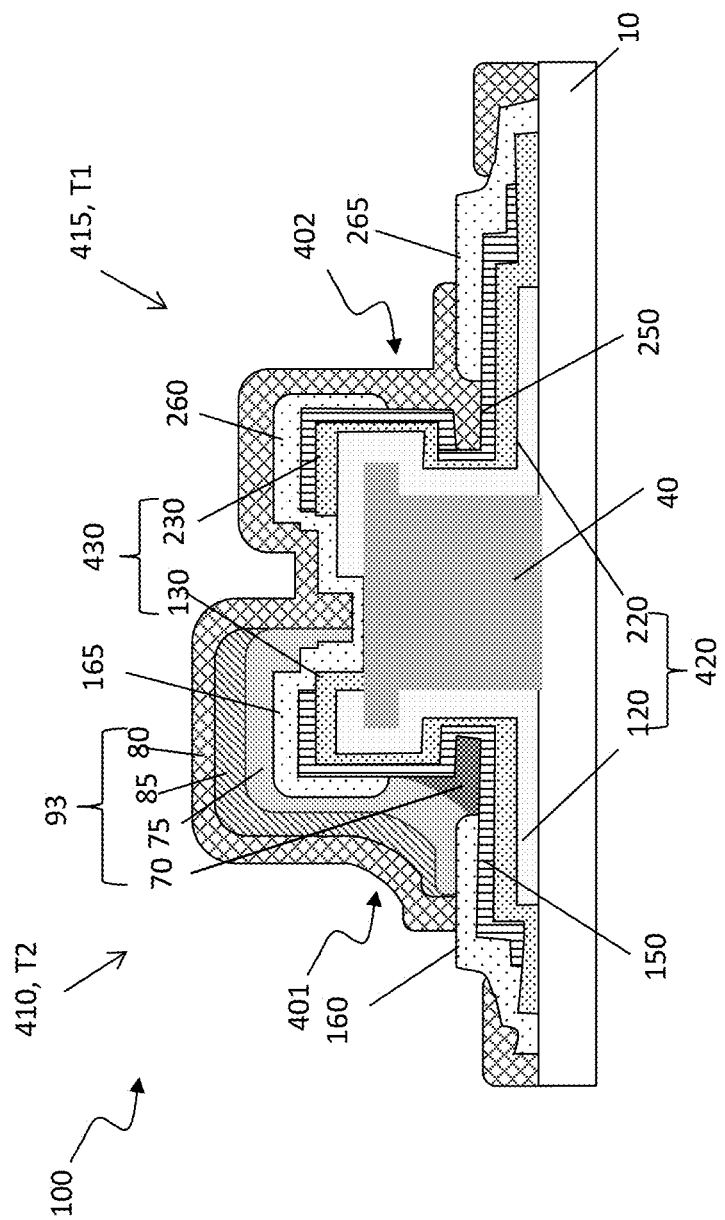
FIG. 9 is a cross-sectional view of another example embodiment of an inverter including a single vertical-support-element, and including another example embodiment of a differential passivation structure.

FIG. 9 illustrates the differential passivation structure 93 with an additional patterned inorganic dielectric layer 85 and another patterned polymer dielectric layer 75 as employed in an inverter formed over a common VTFT gate structure. All other features of the inverters illustrated are the same as shown in FIG. 7, and should be understood from the previous description. The differential passivation structure 93 shown in FIG. 9 is the same as that shown FIG. 5, and should be understood from the previous description. Alternative embodiments of the differential passivation structure 92 and 90 as illustrated in FIGS. 4 and 6 are also useful in inverters formed over a common VTFT gate structure.

Figure 10A:
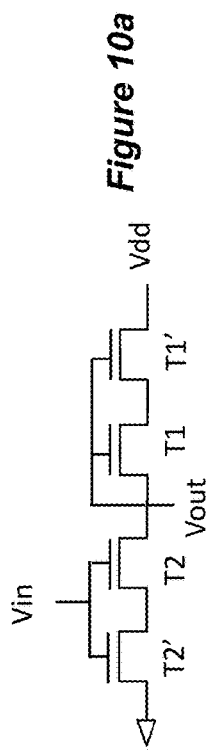
FIG. 10a is an equivalent circuit of the enhancement-depletion mode inverter shown in FIG. 10b.
Figure 10B:
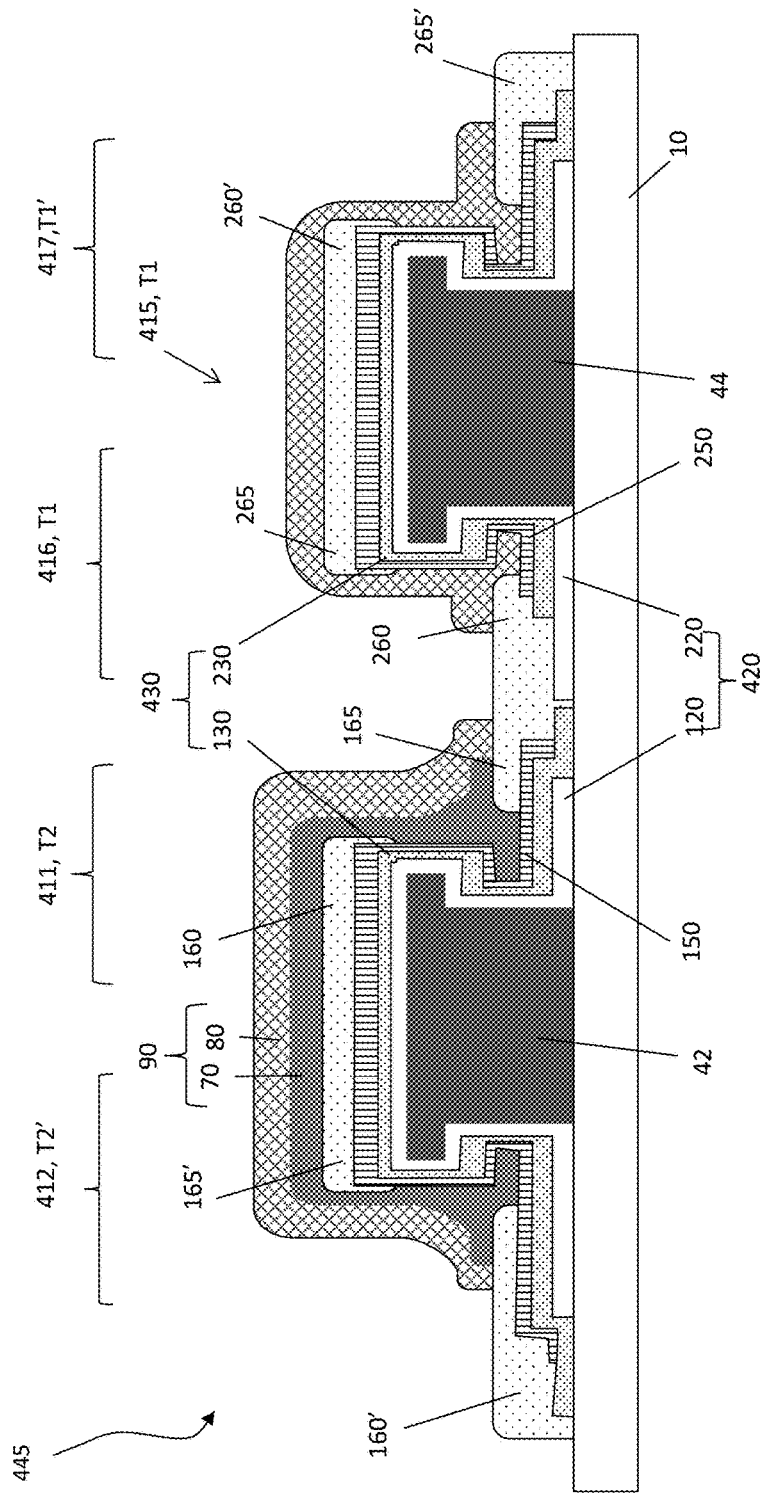
FIG. 10b is a cross-sectional view of an enhancement-depletion mode inverter including two vertical-support-elements having the equivalent circuit shown in FIG. 10a, and including another example embodiment of a differential passivation structure.

FIG. 10b illustrates an enhancement-depletion mode inverter using the differential passivation structure 90 of the present invention. The inverter of FIG. 10b is a cross-sectional view of an inverter having an equivalent circuit shown in FIG. 10a. In FIG. 10a, an equivalent circuit for an enhancement-depletion-mode inverter is shown. The inverter includes the two load transistors T1, T1' connected in series with a shared load gate and two drive transistors T2, T2' connected in series with a shared drive gate. Each of the transistors include an oxide semiconductor. The load transistors T1 and T1' are operated in a depletion mode and have an inorganic dielectric in contact with the load back-channel of each transistor. The drive transistors T2, T2' are operated in enhancement mode and have a bottom gate architecture having a polymer layer in contact with the drive back-channel of each transistor. The equivalent circuit of FIG. 10a has the same features as the circuit of FIG. 2, with the addition of the series connected transistors. When forming VTFTs using a VTFT gate structure, for simplicity in processing it can be preferable to form two transistors in series over a single structure rather than to use each reentrant profile independently.

Vertical transistors drive VTFT 411 and 412 are connected in series and formed over a single gate structure 42. As shown in FIG. 10b, there is a separate drive gate electrode 120 covering the surface of gate structure 42. The gate structure 42 can be either electrically conductive or electrically insulating, depending on the preferred fabrication process. As shown, drive VTFT 411 and 412 are operated in series by applying a voltage to the drive gate electrode 120 that is shared and common, between drive VTFT 411 and 412. A voltage is also applied to the source electrode 160' of drive VTFT 412 and the drive drain electrode 165 of drive VTFT 411. This mean of actuation of the two drive transistors in series is advantageous because external electrical connections do not need to be made to the elevated electrodes 165' or 160. Similarly load VTFT 416 and 417 are connected in series and formed over a single gate structure 44; gate structure 44 can be either insulating or conducting however it is preferable to have the same property as gate structure 40. Load VTFT 416 and 417 are actuated analogously to drive VTFT 411 and 412, which should be understood from the equivalent circuit diagram of FIG. 10a.

The transistors of FIG. 10b are otherwise composed of the same elements as the transistors of FIGS. 1 and 7. The load and drive VTFTs 416, 417 and 411, 412 are preferably formed from common patterned material layers. The drive and load gate electrodes 120, 220 are part of a common patterned conformal conductor layer 420. Similarly the drive and load semiconductor 150, 250 are a common patterned inorganic semiconductor layer, preferably a ZnO containing semiconductor. The patterned dielectric stack 430 is a conformal dielectric stack, which maintains the reentrant profiles, and the drive gate dielectric 130 and load gate dielectric 230 are separate regions of a patterned dielectric stack 430. Patterned dielectric stack 430 can have a single layer as shown in FIG. 7, or can be formed of multiple layers. The dielectric stack can be formed from layers having different patterns, so that the load gate dielectric and the drive gate dielectric have different thickness The differential passivation structure 90 shown in FIG. 10b is the same as that in FIG. 1 and FIG. 7. Differential passivation structure 90 has a patterned polymer dielectric layer 70 that is in contact with the drive back-channel region of both drive VTFT 411 and 412. Differential passivation structure 90 has a conformal inorganic dielectric layer 80 that is in contact with the load back-channel of load VTFT 416 and 417. As shown, there is a via in differential passivation structure 90 over a portion of the Vout electrode (165, 260) in order to make external electrical contact. The salient features of the differential passivation structure 90 should be understood from the previous descriptions, and has the same advantage of providing the ability to independently tune the threshold voltage of the load and drive transistors that would otherwise have the same threshold voltage. The addition of the VTFT in series as shown in FIG. 10b allows for the easy fabrication of high performance enhancement-depletion mode inverters. Any of the previously discussed differential passivation structures 90, 91, 92 and 93, could be used in place of the differential passivation structure 90 shown in FIG. 10b in the present invention.

Figure 11:
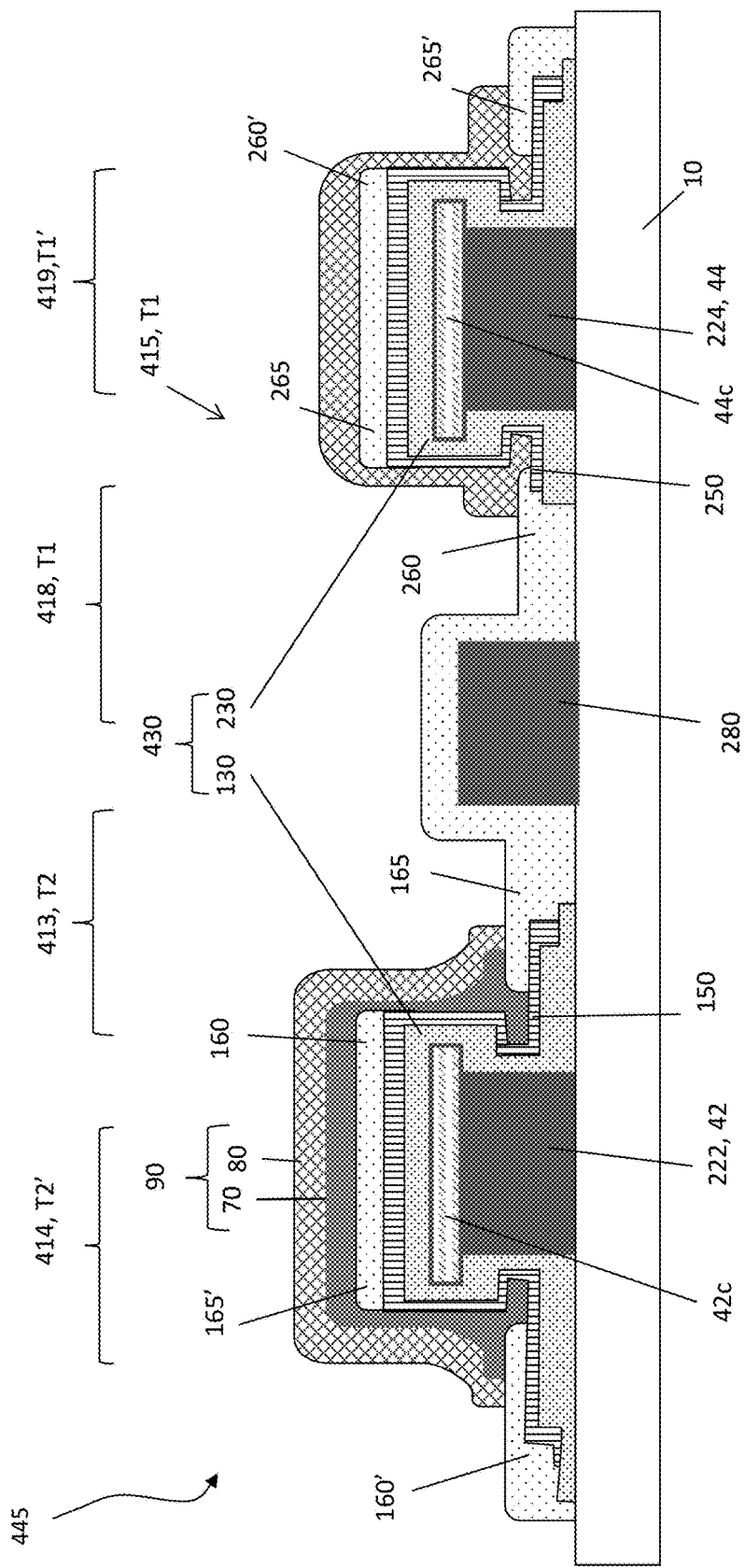

FIG. 11 is a cross-sectional view of an alternative enhancement-depletion mode inverter using the differential passivation structure of the present invention having an equivalent circuit shown in FIG. 10a. As shown the inverter includes the two load transistors T1, T1' connected in series with a shared load gate, and two drive transistors T2, T2' connected in series with a shared drive gate. Vertical transistors 413 and 414 are connected in series and formed over a single gate structure 42. As shown, gate structure 42 is conductive and serves as the drive gate electrode 222. Similarly vertical transistors load VTFT 418 and 419 are connected in series and formed over a single gate structure 44, where gate structure 44 is conductive and serves as the load gate electrode 224. In preferred embodiments, the load and drive gate electrodes 224 and 222 are part of a common patterned conductive layer. As shown, gate structures 42 and 44 have separate cap 42c and 44c over the conductive posts to define the reentrant profiles; however this structure would work equally well with a gate structure of uniform material composition. As noted earlier, the figures are not drawn to scale, and the apparent ungated region present in FIG. 11 is, in reality, controlled to not exist, or at least be very small, by controlling the profile of the edge of the gate structure/gate electrode. The cross-section shown in FIG. 11 illustrates the use of an additional conductive area 280 to electrically connect the drain 165 of the drive VTFT 413 to the source of the load VTFT 418. Additional conductive area 280 is formed in same patterned first conductive layer as the drive and load gate electrodes 222 and 224.

The transistors of FIG. 11 are otherwise composed of the same elements as the transistors of FIG. 10b. The differential passivation structure 90 which controls the performance of the VTFTs 413, 414, 418 and 419 is the same as discussed above and should be well understood.

Figure 12A:
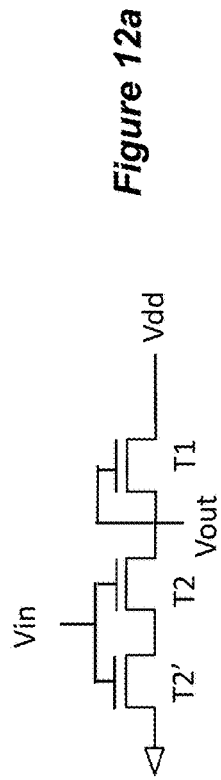
FIG. 12a is an equivalent circuit of the enhancement-depletion mode inverter shown in FIG. 12b.
Figure 12B:
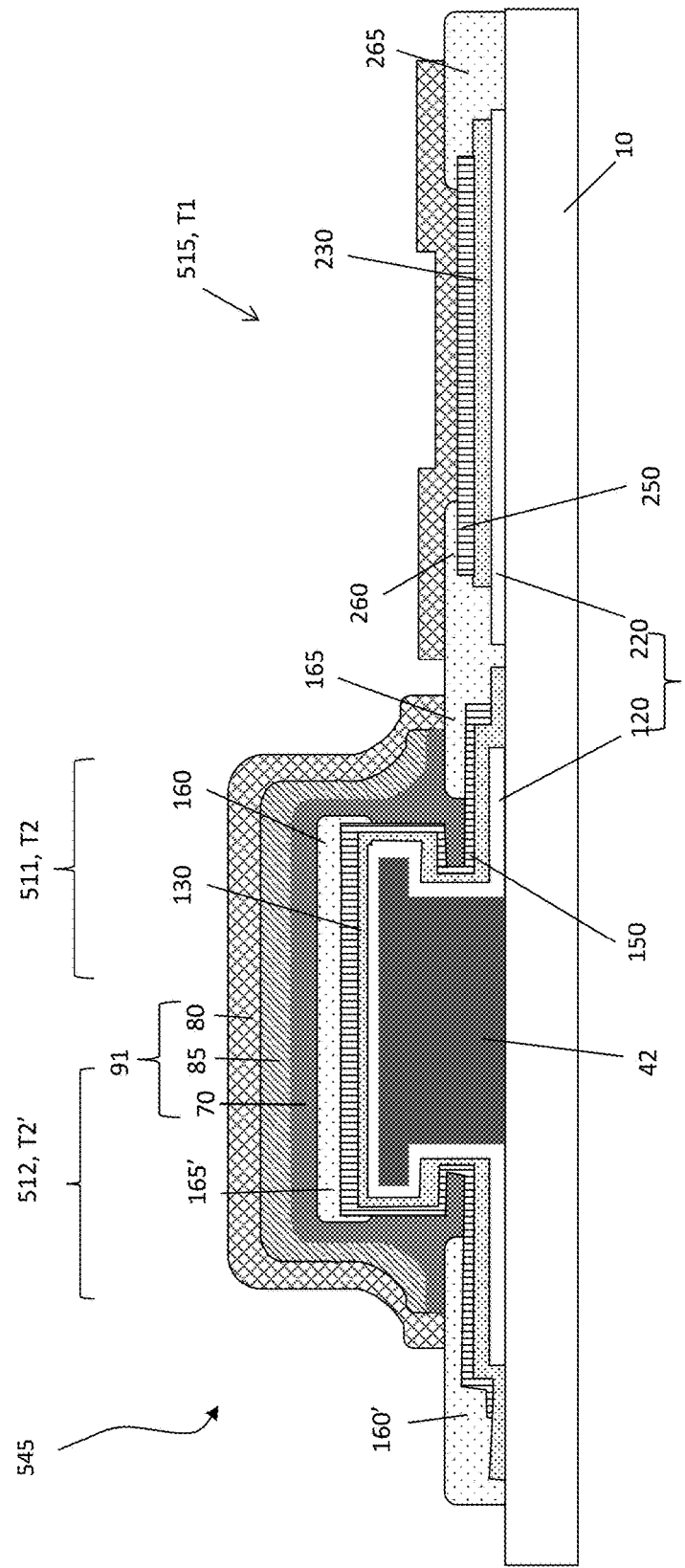
FIG. 12b is a cross-sectional view of another example embodiment of an enhancement-depletion mode inverter having the equivalent circuit shown in FIG. 12a, and including another example embodiment of a differential passivation structure.

FIG. 12b illustrates an enhancement-depletion mode inverter having a mixed architecture and the differential passivation structure 91 of the present invention. The inverter of FIG. 12b is a cross-sectional view of an inverter having an equivalent circuit shown in FIG. 12a. In FIG. 12a, an equivalent circuit for an enhancement-depletion-mode inverter is shown. The inverter includes a single bottom gate load VTFT 515, T1 and two vertical transistors drive VTFT 511, T2 and 512, T2' connected in series with a shared drive gate. Each of the transistors include an oxide semiconductor. The load VTFT 515, T1 is operated in a depletion mode and has an inorganic dielectric 80 in contact with the back-channel of the transistor. The drive VTFT 511, T2 and 512, T2' are operated in enhancement mode and have a bottom gate architecture having a patterned dielectric polymer layer 70 in contact with the drive back-channel. The equivalent circuit of FIG. 12a has the same features as the circuit of FIG. 2, with the addition of the series connected drive transistors. When forming inverters it can be advantageous to use transistors of different architectures to more easily access a wide range of channel dimensions to tune the performance of the circuit. Commonly-assigned copending U.S. patent application Ser. No. 14/737,544 discusses advantages and example architectures of mixed architecture circuits, and is incorporated by reference herein in its entirety.

Vertical transistors drive VTFTs 511 and 512 are connected in series and formed over a single gate structure 42. As shown, there is a drive gate electrode 120 covering the surface of gate structure 42. This arrangement is the same as the embodiment illustrated in FIG. 10*b*, and should be understood from the previous description. The transistors of FIG. 12*b* are otherwise composed of the same elements as the transistors of FIGS. 1 and 7. The load TFT, 515, T1 is the same as the load TFT illustrated in FIGS. 1 through 7, namely a bottom gate depletion-mode TFT under a portion of the differential passivation layer 90 such that patterned conformal inorganic dielectric layer 80 is in contact with the back-channel of the device.

The load TFT 515 and drive VTFTs 511, 512 are preferably formed from common patterned material layers. The drive and load gate electrodes 120, 220 are part of a common patterned conformal conductor layer 520. Similarly the drive and load semiconductor 150, 250 are a common patterned inorganic semiconductor layer, preferably a ZnO containing semiconductor. The drive gate dielectric 130 is a conformal dielectric stack which maintains the reentrant profiles of VTFT gate structure 42. Drive gate dielectric 130 and load gate dielectric 230 are separate regions of a patterned dielectric stack. Dielectric stack can have a single layer as shown, or can be formed of multiple layers. The dielectric stack can be formed from layers having different patterns, so that the load gate dielectric 230 and the drive gate dielectric 130 have different thickness.

The differential passivation structure 91 shown in FIG. 12*b* is the same as that in FIG. 3*a* and FIG. 8. Differential passivation structure 91 has a patterned polymer dielectric layer 70 that is in contact with the drive back-channel of both drive VTFTs 511 and 512. Differential passivation structure 91 has a conformal inorganic dielectric layer 80 that is in contact with the load back-channel of load TFT 515. Differential passivation structure 91 had an additional patterned inorganic dielectric layer 85 having the same pattern as the patterned polymer dielectric layer 70. As shown, there is a via in passivation structure 91 over the Vout electrode (165, 260) in order to make external electrical contact. The salient features of the differential passivation structure should be understood from the previous descriptions, and has the same advantage of providing the ability to independently tune the threshold voltage of the load and drive transistors that would otherwise have the same threshold voltage. The addition of the series connected drive VTFTs in combination with a planar load TFT, as shown in FIG. 12*b* allows for the easy fabrication of high performance enhancement-depletion mode inverters and the ability to access a wide range of channel dimensions for circuit optimization. Any of the previously discussed passivation structures 90, 91, 92 and 93 of the present invention, could be used in place of the differential passivation structure 91 illustrated in FIG. 12*b*.

Figure 13:
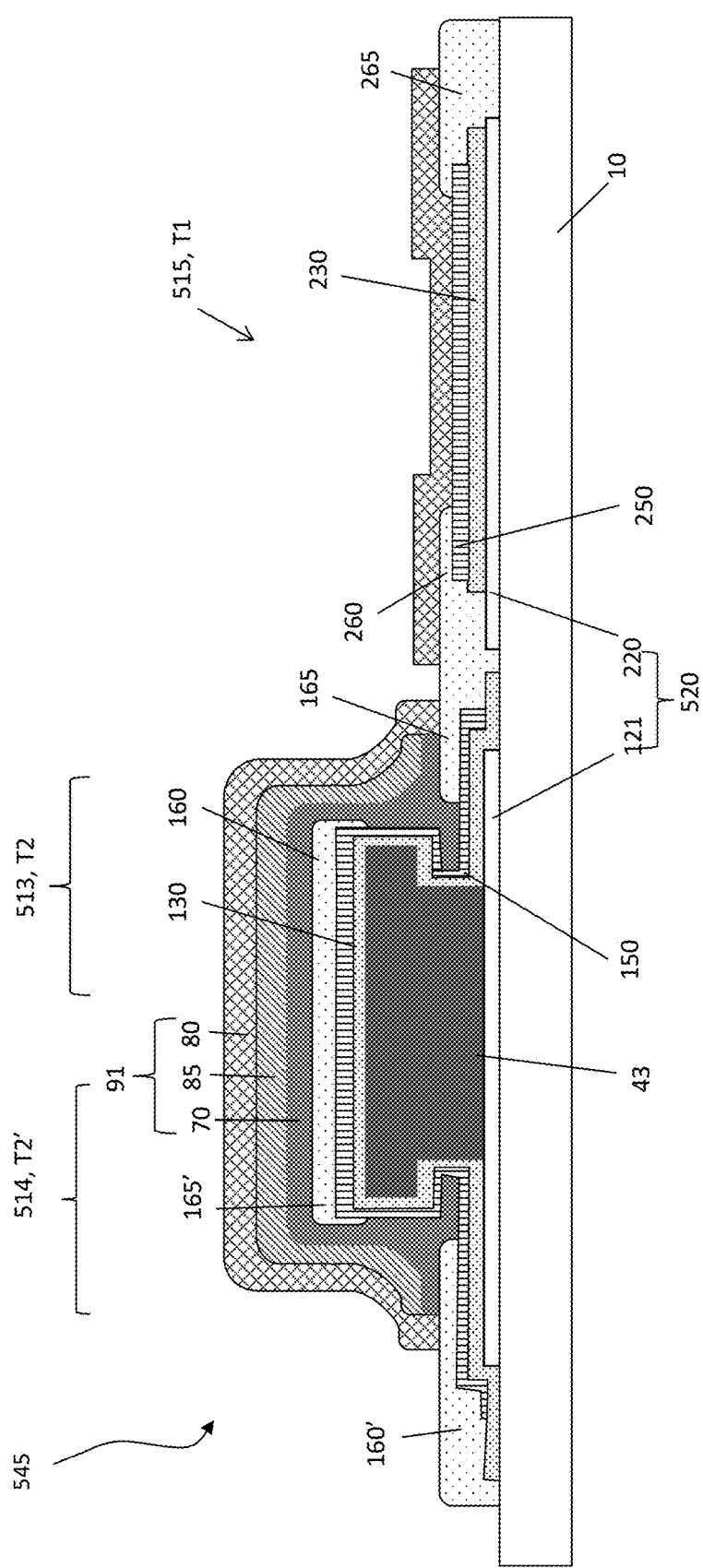
FIG. 13 is a cross-sectional view of another example embodiment of an enhancement-depletion mode inverter having the equivalent circuit shown in FIG. 12a, and including the differential passivation structure shown in FIG. 12b.

FIG. 13 is a cross-sectional view of an enhancement-depletion mode inverter having a mixed architecture and the differential passivation structure of the present invention; the inverter of FIG. 13 has an equivalent circuit shown in FIG. 12*a*. The inverter illustrated in FIG. 13 is the same as the embodiment illustrated in FIG. 12*b*, with the exception of the details of the gate for the drive transistors. As shown in FIG. 13, the shared gate of the vertical drive transistors 513 and 514 is composed of an electrically conductive gate structure 43 and an electrically conductive region 121 under the electrically conductive gate structure 43. Electrically conductive region 121 serves as insurance that there is no ungated region at the base of electrically conductive gate structure 43. The first patterned electrically conductive layer includes region 121 and the gate of the load TFT 515. All other elements of the inverter illustrated in FIG. 13 are the same as those in FIG. 12, and should be understood from the previous descriptions. FIG. 13 serves to further illustrate that a variety of architectures can benefit from the differential passivation structures of the present invention.

Differential passivation structure allows for the independent control of transistor performance through control of the material in contact with the back-channel of the device. Transistors can be made from shared materials layers, and can preferably have identical components, and be tuned by the differential passivation structure. The invention has been described in detail with particular reference to certain preferred transistor architecture, however it should be understood that variations, modifications, and architectures can benefit from the differential passivation structure and are within the scope of the invention.

EXAMPLES

Figure 14:
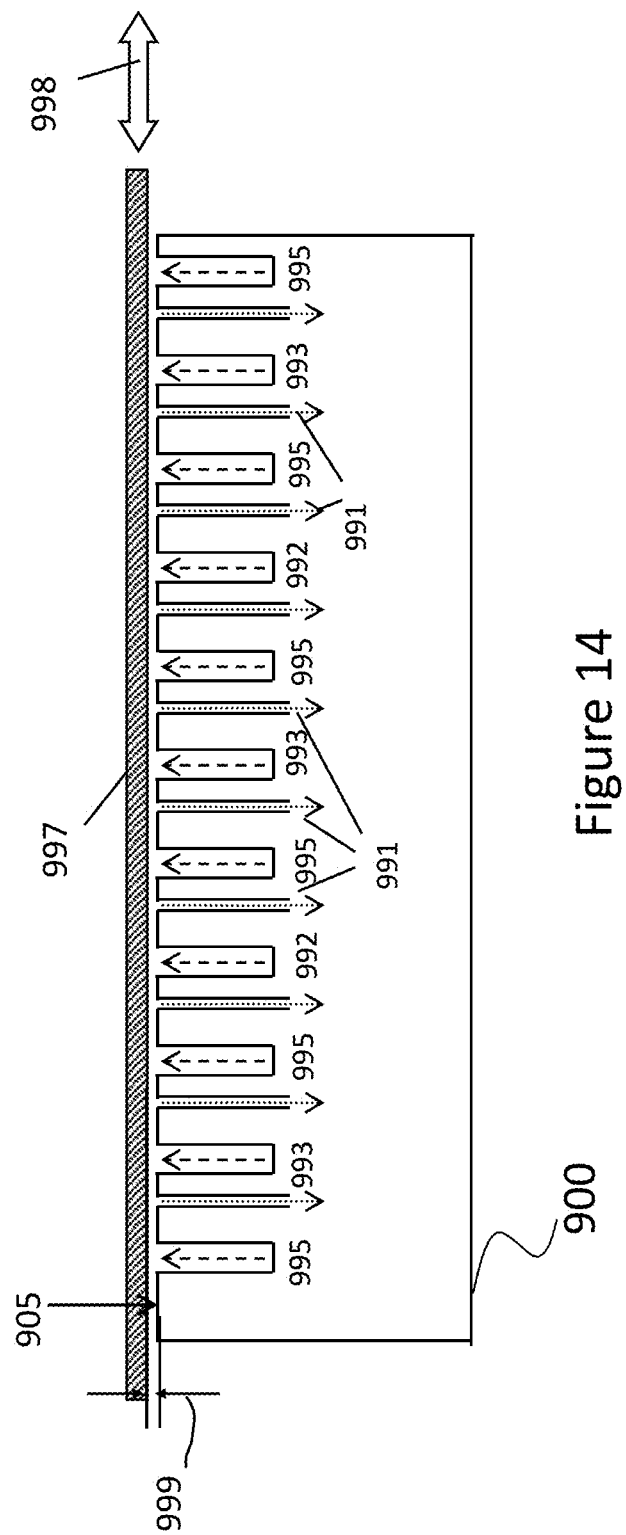
FIG. 14 is a cross-sectional side view of a deposition device used for thin film deposition in the Examples.

General Conditions for the Preparation of Layers Using Atmospheric Pressure ALD The preparation of a thin film coating of the material layers on glass substrates as used in the examples is described below. The ALD coating device used to prepare these layers, namely aluminum oxide, ZnO:N, and Al-doped ZnO (AZO), has been described in detail in commonly assigned US Patent Application Publication No. U.S. 2009/0130858, the disclosure of which is incorporated herein by reference in its entirety. The coating device has an output face (facing up) that contains spatially separated elongated gas channels and operates on a gas bearing principle. The coating device can be understood with respect to delivery head 900 shown in FIG. 14. Each gas channel is composed of an output slot 995, 993, 992 which supplies gas to the output face 905, and adjacent exhaust, or vacuum, slots 991 which remove gas from the output face 905. The order of the gas channels is P-O-P-M-P-O-P-M-P-O-P where P represents a purge channel, O represents a channel containing an oxygen based precursor, and M represents a channel containing a metal based precursor. The flow of gases from the delivery head 900 additionally act to maintain a gap 999 between substrate 997 and deliver head 900. As a substrate 997 moves relative to the coating head as indicated by arrow 998 it sees the above sequence of gases which results in ALD deposition.

A 2.5×2.5 inch square (62.5 mm square) glass substrate attached to a heated backer is positioned above the output face of the coating device and is maintained in close proximity to the output face by an equilibrium between the pull of gravity, the flow of the gases supplied to the output face, and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI), trimethylaluminum (TMA), and diethyl zinc (DEZ). The flow rate of the active metal alkyl vapor was controlled by bubbling nitrogen through the pure liquid precursor contained in an airtight bubbler by means of individual mass flow control meters.

This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating of both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the substrate across the coating head for the number of cycles necessary to obtain a uniform deposited film of the desired thickness for the given example. The coating head as described above contains two full ALD cycles (two oxygen and two metal exposures per single direction pass over the head), therefore a round trip oscillation represents 4 ALD cycles. All samples were coated at a substrate temperature of 200° C.

TABLE 1

| Layer | $DMA_f$ bubbler flow (sccm) | TMA bubbler flow (sccm) | DEZ bubbler flow (sccm) | NH3 flow (sccm) | Water bubbler flow (sccm) | $N_2$ dilution with Metal Alkyl (sccm) | $N_2$ dilution with water (sccm) | $N_2$ Inert Purge (sccm) |
|---|---|---|---|---|---|---|---|---|
| $Al_2O_3$ | 65 | 0 | 0 | 0 | 65 | 1500 | 2250 | 3000 |
| $Al_2O_3$ | 0 | 30 | 0 | 0 | 22.5 | 1500 | 2250 | 3000 |
| ZnO | 0 | 0 | 60 | 0 | 45 | 1500 | 2250 | 3000 |
| AZO | 10 | 0 | 30 | 0 | 22.5 | 1500 | 2250 | 3000 |

Circuit Elements with Planar Bottom-Gate TFTs and Differential Passivation

In order to probe the ability to independently control the behavior of bottom gate TFTs, and fabricate inverters and circuits using the differential passivation structure of the present invention, devices were built using the spatial atomic layer deposition tool described above. The Example TFTs were fabricated as described below and the relative differences between the samples are called out in the following descriptions for clarity. Electrical testing of the transistors was accomplished by using a probe station to contact the gate and source/drain electrodes. The transistors were swept in the linear regime, with the drain being held constant at and the gate voltage was swept. The threshold voltage (Vth) were extracted from the measurements taken, a positive threshold voltage is an indicator of an enhancement-mode device, while a negative threshold is an indicator of a depletion-mode device. For all devices tested there was minimal gate leakage, less than $1*10^{-10}$ at the maximum applied field.

Comparative Example C1

As Fabricated Bottom Gate TFT with PVP Deposition Inhibitor on a Glass Substrate Comparative Example C1 is a bottom-gate device having a simple polymer in contact with the back-channel of the TFT. Comparative Example C1 was fabricated using the combination of spatial ALD and selective area deposition (SAD). The gate layer was 1000 Å of AZO, the gate dielectric was 500 Å of $Al_2O_3$, 200 Å of ZnO:N was used for the semiconductor layer and 1000 Å AZO was used for the source and drain electrodes. The printed inhibitor used to pattern each of the device layers was a 2 wt % polyvinyl pyrrolidone (PVP) k30 in diacetone alcohol solution which was printed using a Dimatix 2500 printer. The pattern of PVP used to pattern the AZO layer in to the source and drain was left on the device during testing, such that the back-channel of the semiconductor layer was covered by a thin layer of PVP k30. The transistor dimensions as designed were W=6 pixel/L=1 pixel, resulting in fabricated channel dimensions of approximately W=400 microns, and L=95 microns. The extracted performance values for Comparative Example C1 can be found in Table 2.

Comparative Example C2

Bottom Gate TFT with NO Passivation on a Glass Substrate

Comparative Example C2 is a bottom gate TFT which had all materials that were in contact with the semiconductor back-channel removed. Comparative Example C2 was fabricated like Comparative Example C1 using the combination of spatial ALD and selective area deposition (SAD), and was formed from the same material stack and transistor geometry. The PVP pattern used to pattern the AZO layer in to the source and drain was removed from the device using a 100 W 0.3 Torr oxygen plasma, in a Technics PEIIA parallel plate system. Prior to removing the PVP from the back-channel, the behavior of Comparative Example C2 measured and found to be similar to that of Comparative Example C1. However, removing the polymer from the back-channel caused the transistor behavior to change, with a negative shift in Vth of 3.6 volts. The characteristic performance parameters for Comparative Example C2 can be found in Table 2.

Inventive Example I1

Differential Passivation Structure with One Polymer Layer

Inventive Example I1 uses a differential passivation structure of the present invention having a single patterned polymer dielectric layer used to control performance of bottom-gate transistors. The differential passivation structure has the same structure and features as the differential passivation structure illustrated in FIG. 3a. Inventive Example I1 was fabricated as Comparative Example C2 with the following exceptions. After removing the PVP used to pattern the source and drain electrodes, the transistors on the substrate were selectively passivated using the differential passivation structure of the present invention. The patterned polymer dielectric layer 70 was formed by spinning on a 15% solution of SU-8 2010 in PGMEA. The SU-8 was blanket exposed and cured at 225° C., resulting in a cured layer of SU-8 with a nominal thickness of 2000 Å. After curing the SU-8, the surface was treated with a 30 second 100 W 0.3 Torr oxygen plasma to enable the growth of Al2O3 on the SU-8 surface. A 2% solution of PVP k30 was printed on the SU-8 surface to define the pattern for the additional patterned inorganic dielectric layer 85 of the differential passivation structure 90. The pattern was chosen such that only the desired enhancement-mode transistors (I1-Enh) had open areas above the TFT back-channel. The sample was then coated with 250 Å of DMAI-based $Al_2O_3$ using the SALD system described above with DMAI as the precursor at 200° C.; the PVP inhibited the growth such that $Al_2O_3$ was only deposited in the areas on the SU-8 surface that did not have PVP located above the back-channel of desired enhancement-mode transistors I1-Enh. The SU-8 was then patterned using a 5 minute oxygen plasma at 300 W and 0.4 Torr, which removed the PVP inhibitor and the SU-8 that was not protected by the additional patterned $Al_2O_3$ inorganic dielectric layer, resulting in a patterned polymer dielectric layer 70 with pattern having an area that lies within the pattern of the additional patterned inorganic dielectric layer 85. Next A 2% solution of PVP k30 was printed on the substrate surface to define the pattern for the vias in the patterned conformal inorganic dielectric layer 80 of the differential passivation structure 91. The pattern was chosen so that the vias as defined by the PVP printed area, were only present over conductive pads to provide access for external electric testing. The sample was then coated with 750 Å of DMAI-based $Al_2O_3$ using the SALD system described above with DMAI as the precursor at 200° C.; the PVP inhibited the growth such that $Al_2O_3$ was deposited over the substrate including in contact with the back-channel of desired depletion-mode transistors I1-Dep and in contact with the additional patterned inorganic dielectric layer over the back-channel of the desired enhancement-mode transistors I1-Enh. The devices were finished by removing the PVP used to pattern the vias in the conformal inorganic dielectric layer using a 100 W, 0.3 Torr 2 minute oxygen plasma. The only difference between the desired-enhancement-mode TFTs I1-Enh and desired-depletion-mode TFTs I1-Dep is the portion of the differential passivation structure that is in contact with the back-channel of the device. The individual transistors (W/L=6/1) were tested as Comparative Example C1, and the characteristic performance parameters for Inventive Example 1 I1-Enh and I1-Dep can be found in Table 2. Additionally, the substrate of Inventive Example 1 contained inverters (I1-Inv) configured as illustrated in FIG. 3a. The drive transistors for each inverter had as designed W=12 pixel/L=1 pixel, and the load transistors for each inverter had an as designed W=1 pixel/L=3 pixel. The printed resolution is approximately 1 pixel=90 microns. These enhancement-depletion-mode inverters were also fabricated in five stage ring oscillator circuits (I1-RO) on the same substrate. The ring oscillator also had a buffer inverter with a drive transistor as designed W=12 pixel/L=1 pixel, and a load transistor as designed W=4 pixel/L=3 pixel. The circuit I1-RO was analyzed by using a probe station to contact the AZO Vdd, ground, and output nodes of the ring oscillator, and the oscillator was characterized as a function of Vdd. The frequency, time per stage, and fraction of the peak-to-peak swing for can be found in Table 3.

Inventive Example I2

Differential Passivation Structure with Two Polymer Layers

Inventive Example I2 uses a differential passivation structure of the present invention having a two patterned polymer dielectric layers. The differential passivation structure has the same structure and features as the differential passivation structure illustrated in FIG. 5. Inventive Example I2 was fabricated as Inventive Example I1 with the following exceptions. Inventive Example I2 started with transistors as in Comparative Example C1, namely that all transistors had the PVP used to pattern the source and drain electrodes left in contact with the back-channel of devices, and over the remainder of the substrate. The 15% SU-8 solution was then coated and patterned as in Inventive Example I1 using the additional patterned inorganic dielectric layer of 250 A of DMAI-based $Al_2O_3$, resulting in desired enhancement-mode transistors (I2-Enh) having a patterned layer of PVP polymer dielectric PVP (patterned polymer dielectric layer 70) in contact with the back-channel, under an additional patterned polymer dielectric layer 75, and additional patterned inorganic dielectric layer 85. After patterning the additional patterned polymer dielectric layer 75 of the differential passivation structure, a 750 A conformal dielectric stack was formed using two independently patterned layers of DMAI-based $Al_2O_3$. After printing the via pattern, a first layer of 250 A of DMAI-based $Al_2O_3$ was deposited. Next, the PVP from first via pattern printing step was removed using a 2 minute 100 W 0.3 Torr oxygen plasma, and PVP ink was printed in the same via pattern and an additional 500 A of DMAI-based $Al_2O_3$ was deposited. The conformal inorganic dielectric stack was deposited over the substrate including in contact with the back-channel of desired-depletion-mode transistors I2-Dep and in contact with the additional patterned inorganic dielectric layer 85 over the back-channel of the desired enhancement-mode transistors I2-Enh. The devices of Inventive Example I2 were finished as in Inventive Example I1. The characteristic performance parameters for individual transistors Inventive Example I2 I2-Enh and I2-Dep can be found in Table 2. Additionally, the substrate of Inventive Example I2 contained inverters (I2-Inv) configured as illustrated in FIG. 5, having the same dimensions as those in Inventive Example I1-Inv. These enhancement-depletion-mode inverters were also fabricated in five stage ring oscillator circuits (I2-RO) on the same substrate, having the same dimensions and layout as those in Inventive Example I1-RO. The frequency, time per stage, and fraction of the peak-to-peak swing for can be found in Table 3.

TABLE 2

| Sample | Differential Passivation Layer FIG. ID | Material in Contact with Back-channel | N TFT | Vd (V) | Average Vth | Standard Deviation Vth |
|---|---|---|---|---|---|---|
| C1 | n/a | PVP k30 | 19 | 0.2 | 5.51 (1.07) | 1.07 |
| C2 | n/a | none | 1 | 0.2 | 2.60 | n/a |
| I1-Enh | FIG. 3a | SU-8 | 11 | 0.2 | 0.65 | 1.65 |
| I1-Dep | FIG. 3a | $Al_2O_3$ | 5 | 0.2 | −5.69 | 3.18 |
| I1-Enh | FIG. 3a | SU-8 | 17 | 12 | 3.11 | 1.54 |
| I1-Dep | FIG. 3a | $Al_2O_3$ | 13 | 12 | −4.89 | 2.38 |

TABLE 2-continued

| Sample | Differential Passivation Layer FIG. ID | Material in Contact with Back-channel | N TFT | Vd (V) | Average Vth | Standard Deviation Vth |
|---|---|---|---|---|---|---|
| I2-Enh | FIG. 5 | PVP k30 | 12 | 0.2 | 1.37 | 1.32 |
| I2-Dep | FIG. 5 | $Al_2O_3$ | 8 | 0.2 | −5.24 | 2.46 |
| I2-Enh | FIG. 5 | PVP k30 | 16 | 12 | 3.33 | 2.15 |
| I2-Dep | FIG. 5 | $Al_2O_3$ | 18 | 12 | −1.17 | 1.48 |

As can be seen in Table 2, in all cases the inventive desired-enhancement-mode devices have a positive threshold voltage, while the desired-depletion-mode devices have a negative threshold voltage. When the polymer used to pattern the source and drain electrode was removed and the back-channel was passivated with only the $Al_2O_3$ portion of the differential passivation structure, the threshold voltage is negative resulting in a depletion mode TFT as seen by the data for Inventive Examples I1 and I2. If instead, after removing the polymer used to pattern the source and drain electrode, the back-channel is passivated with a portion of the differential passivation structure having a patterned polymer dielectric in contact with the back-channel, the threshold voltage remains positive and the device continues to operate enhancement-mode as shown in Inventive Example I1. Further processing advantages can be gained by eliminating the step of removing the polymer used to pattern the source and drain electrodes as in Inventive Example I2 with similar performance in threshold voltage.

TABLE 3

| Sample | Vdd (V) | Material in Contact with the Drive TFT back-channel | Material in Contact with the Load TFT back-channel | time/stage (us) | Freq (Hz) | fraction |
|---|---|---|---|---|---|---|
| I1-RO | 14 | SU-8 | Al2O3 | 80.60 | 2481 | 0.31 |
| I1-RO | 16 | SU-8 | Al2O3 | 78.60 | 2545 | 0.43 |
| I1-RO | 18 | SU-8 | Al2O3 | 78.20 | 2558 | 0.51 |
| I2-RO | 14 | PVP | $Al_2O_3$ | 86.80 | 2304 | 0.54 |
| I2-RO | 16 | PVP | $Al_2O_3$ | 84.00 | 2380 | 0.60 |
| I2-RO | 18 | PVP | $Al_2O_3$ | 80.00 | 2500 | 0.71 |

From the data in Table 3 it is clear that differential passivation structure of the present invention provided control of the individual transistor performance and yielded functioning enhancement-depletion mode inverters and ring oscillator circuits.

Circuit Elements with VTFTs and Differential Passivation

In order to probe the ability to independently control the behavior of bottom gate VTFTs, and fabricate inverters and circuits using the differential passivation structure of the present invention devices were built using the spatial atomic layer deposition tool described above. The Example VTFTs were fabricated as described below, and the relative differences between the samples are called out in the following descriptions for clarity. Electrical testing of the vertical transistors and circuits was accomplished by using a probe station to contact the gate and source/drain electrodes, and the data was evaluated in the same manner as with the planar bottom gate transistors.

Comparative Example C3

VTFTs without Passivation

Comparative Example C3 are vertical thin film transistors (VTFTs) prior to having the differential passivation structure of the present invention formed on the back-channels. Prior to passivating, all of the vertical transistors of Comparative Example C3 have similar performance. The VTFTs were fabricated using photolithography and spatial ALD. The conductive gate structure was formed by coating a 5000 Å layer of molybdenum on a glass substrate by sputtering, then depositing a spatial ALD layer of 1000 Å of AZO, and patterning the AZO using photoresist and a weak acetic acid etch. The AZO acted as a hard mask for subsequent etching of the molybdenum layer by a 300 W reactive ion etch using SF6 gas. The molybdenum layer was over-etched to form a conductive gate structure, wherein the AZO hard mask, which was conductive, remained in place with its edges extending beyond the remaining Mo. This formed a reentrant profile on the edge of the conductive gate structure. The conductive gate structure was coated with a layer of aluminum oxide, using TMA as the aluminum precursor, as insulator and then a layer of ZnO:N as semiconductor using spatial ALD, at the conditions listed in Table 1. The metal oxide layers were patterned to remain only in the device regions by protecting those regions with photoresist, and etching away the metal oxide in exposed regions. After stripping the resist, approximately 60 nm of aluminum was blanket deposited on the substrate using thermal evaporation. The reentrant profile of the conductive gate structure separates the source and drain electrodes vertically over the gate structure as shown in FIGS. 7 through 13, since the line-of-sight evaporation is blocked by the top of the reentrant profile. The aluminum blanket was further patterned for the source and drain electrodes by photolithography, using tetramethyl ammonium hydroxide (TMAH), pH adjusted to about 10, at 50° C. to etch the aluminum. The VTFTs on the substrate were all nominally identical at this stage of processing. VTFTs of comparative example C3 were electrically characterized and the results are tabulated in Table 4. The unpassivated VTFTs of comparative example C3 are all enhancement-mode devices.

Inventive Example 13

VTFTs Having a Differential Passivation Structure with a Single Polymer Layer

Inventive Example 13 are vertical thin film transistors (VTFTs) having the differential passivation structure of the present invention. After characterization of the comparative example C3 VTFTs, the sample was passivated using the differential passivation structure of the present invention. The differential passivation structure was formed by spinning on a 30% solution of SU-8 2010 in PGMEA. The SU-8 was exposed pattern-wise to remain over the subset of devices chosen for enhancement-mode VTFTs I3-Enh. The substrate was then post-exposure baked for 1 minute at 95° C., and developed in PGMEA. The final curing was at 210° C., resulting in a cured layer of SU-8 with a nominal thickness of 5000 Å, with SU-8 filling the reentrant profile of the enhancement-mode vertical transistors and leaving SU-8 in contact with the back-channel of the I3-Enh VTFTs. After curing the SU-8, the surface was treated with a 15 second 100 W, 0.3 Torr oxygen plasma to enhance the growth of $Al_2O_3$ on the SU-8 surface. The sample was then coated at 200° C. with 500 Å of $Al_2O_3$ using the SALD system described above with TMA as the precursor. The $Al_2O_3$ was therefore in contact with the SU-8 on the enhancement-mode VTFTs I3-Enh, and in contact with the back-channel of the depletion-mode VTFTs I3-Dep. Vias were patterning into the $Al_2O_3$ using photolithography and etching with TMAH, pH adjusted to about 10, at 50° C. to allow contact to the aluminum electrodes and the conductive gate structure. The transistors on the substrate were then characterized in the same manner as comparative example C3, and the results are shown in Table 3. The I3-Enh VTFTs having SU-8 in contact with the back-channel maintained a positive threshold voltage, remaining enhancement-mode devices. The I3-Dep VTFTs having $Al_2O_3$ in contact with the back-channel have a negative threshold voltage after passivation, and behave as depletion-mode devices.

TABLE 4

| Sample | Differential Passivation Layer FIG. ID | Material in Contact with back-channel | N TFT | Vd (V) | Average Vth | Standard Deviation Vth |
|---|---|---|---|---|---|---|
| C3 | n/a | none | 206 | 0.2 | 2.50 | 0.24 |
| I3-Enh | FIG. 10b | SU-8 | 78 | 0.2 | 1.43 | 0.61 |
| I3-Dep | FIG. 10b | $Al_2O_3$ | 67 | 0.2 | −0.62 | 0.67 |

As can be seen in Table 4, in all cases the inventive desired-enhancement-mode devices have a positive threshold voltage, while the desired-depletion-mode devices have a negative threshold voltage. When the back-channel was passivated with only the $Al_2O_3$ portion of the differential passivation structure, the threshold voltage is negative resulting in a depletion mode TFT (I3-Dep). If instead, the back-channel is passivated with a portion of the differential passivation structure having a patterned polymer dielectric in contact with the back-channel, the threshold voltage remains positive and the device continues to operate in enhancement-mode as seen from the data for I3-Enh.

Inventive Example 14

Vertical TFT Enhancement-Depletion-Mode Inverters with Differential Passivation

Figure 15:
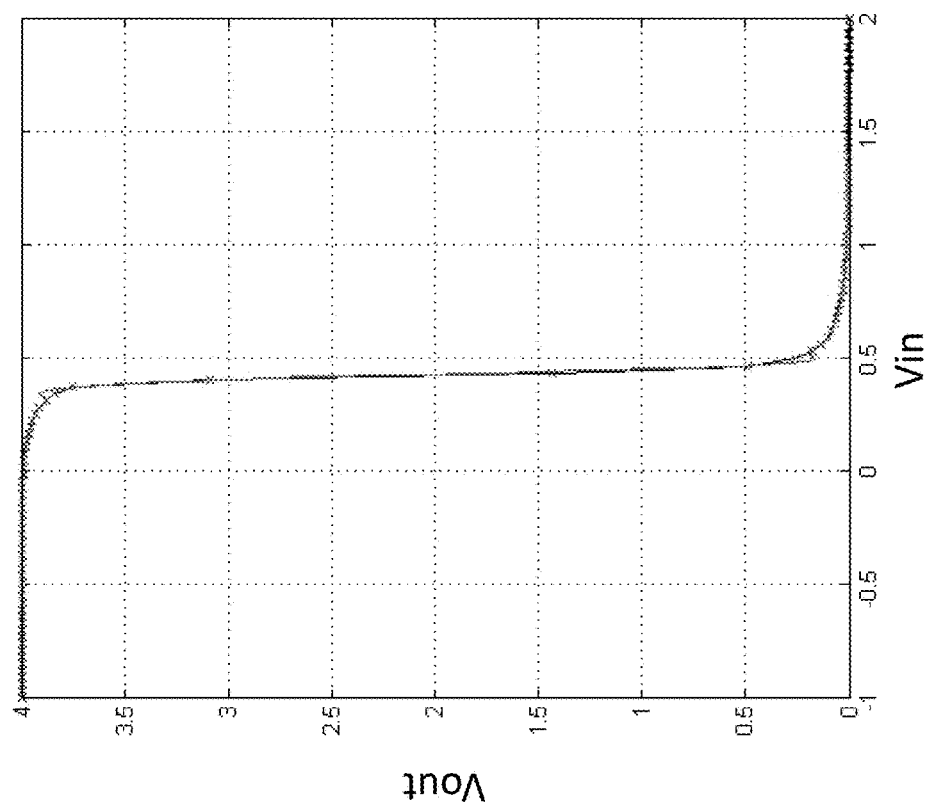
FIG. 15 is a graph illustrating the relationship between input voltage and output voltage for enhancement-depletion-mode inverter 14 discussed in the Examples.

Inventive Example I4-Inv is an VTFT inverter circuit fabricated as Inventive Example I3, with the exception that the aluminum source/drain contacts were patterned using a lift-off process, rather than an etch process. The inverter I4-Inv has the structure illustrated in FIG. 11, with differential passivation layer 90. Inverter I4-Inv was tested by sweeping Vin from −1 V to 2 V, at a Vdd of 4V and measuring Vout. The data for I4-Inv can be found in FIG. 15. FIG. 15 clearly illustrates the effectiveness of the differential passivation structure of the present invention to control of the individual transistor performance and yield functioning enhancement-depletion mode inverters having vertical TFT architectures.

The invention has been described in detail with particular reference to certain preferred example embodiments thereof, but it will be understood that variations and modifications can be effected within the scope of the invention.

PARTS LIST 10 substrate
20 first patterned conductive layer
30 patterned inorganic dielectric stack
40 gate structure
42 gate structure
42c cap
43 electrically conductive gate structure
44 gate structure
44c cap
70 patterned polymer dielectric layer
75 additional patterned polymer dielectric layer
80 patterned conformal inorganic dielectric layer
85 additional patterned inorganic dielectric layer
90 differential passivation structure
91 differential passivation structure
92 differential passivation structure
93 differential passivation structure
100 inverter
101 inverter
102 inverter
103 inverter
110 drive transistor
112 bottom gate TFT
113 bottom gate TFT
120 drive gate electrode
121 electrically conductive region
130 drive gate dielectric
150 drive semiconductor
160 drive source
160' source electrode
165 drive drain
165' elevated electrode
210 load transistor
220 load gate electrode
222 drive gate electrode
224 load gate electrode
230 load gate dielectric
250 load semiconductor
260 load source
265 load drain
280 additional conductive area
400 inverter
401 reentrant profiles
402 reentrant profiles
410 drive VTFT
411 drive VTFT
412 drive VTFT
413 drive VTFT
414 drive VTFT
415 load VTFT
416 load VTFT
417 load VTFT
418 load VTFT
419 load VTFT
420 first patterned conductive layer
430 patterned dielectric stack
511 drive VTFT
512 drive VTFT
513 drive VTFT
514 drive VTFT
515 load TFT
520 first patterned conductive layer
900 delivery head
905 output face
991 vacuum
992 metal precursor flow
993 oxygen precursor flow
995 nitrogen purge flow
997 example substrate
998 arrow
999 gap

The invention claimed is:

1. An enhancement-depletion circuit element comprising:
a depletion-mode load transistor and an enhancement-mode drive transistor formed from the common elements of:
 a first patterned conductive layer including a load gate electrode and a drive gate electrode;
 a patterned inorganic dielectric stack including a load gate dielectric and a drive gate dielectric;
 a patterned inorganic semiconductor layer including a load semiconductor region and a drive semiconductor region;
 a second patterned conductive layer including a load source, a load drain, a drive source and a drive drain; and
 a patterned differential passivation structure having a patterned polymer dielectric layer and a patterned conformal inorganic dielectric layer;
the depletion-mode load transistor having a load back-channel in contact with the patterned conformal inorganic dielectric layer; and
the enhancement-mode drive transistor having a drive back-channel in contact with the patterned polymer dielectric layer.

2. The element of claim 1, wherein the load transistor and the drive transistor each have a planar bottom-gate architecture.

3. The element of claim 1, wherein the load transistor and the drive transistor each have a vertical bottom-gate architecture.

4. The element of claim 3, wherein the drive transistor is a first drive transistor, and further comprising a drive VTFT structure and a second drive transistor connected in series and sharing the drive gate with the first drive transistor, the second drive transistor having a vertical bottom-gate architecture, the first drive transistor and the second drive transistor being formed over the drive VTFT structure.

5. The element of claim 3, wherein the load transistor is a first load transistor, and further comprising a load VTFT structure and a second load transistor connected in series and sharing the load gate with the first load transistor, the second load transistor having a vertical bottom-gate architecture, the first load transistor and the second load transistor being formed over the load VTFT structure.

6. The element of claim 1, wherein the load transistor has a planar bottom-gate architecture and the drive transistor has a vertical bottom-gate architecture.

7. The element of claim 6, wherein the drive transistor is a first drive transistor, and further comprising a drive VTFT structure and a second drive transistor connected in series and sharing the drive gate with the first drive transistor, the second drive transistor having a vertical bottom-gate architecture, the first drive transistor and the second drive transistor being formed over the drive VTFT structure.

8. The element of claim 1, wherein a thickness of the load gate dielectric is greater than that of the drive gate dielectric.

9. The element of claim 1, wherein the semiconductor layer is a ZnO based semiconductor.

10. The element of claim 1, further comprising an additional patterned polymer dielectric layer.

11. The element of claim 1, further comprising an additional patterned inorganic dielectric layer.

* * * * *